United States Patent
Ishizaki et al.

(10) Patent No.: US 8,922,018 B2
(45) Date of Patent: Dec. 30, 2014

(54) SEMICONDUCTOR DEVICE AND SEMICONDUCTOR DEVICE MANUFACTURING METHOD

(75) Inventors: Takeshi Ishizaki, Yokohama (JP); Atsuko Sakata, Yokohama (JP); Junichi Wada, Yokohama (JP); Masahiko Hasunuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/427,268

(22) Filed: Mar. 22, 2012

(65) Prior Publication Data

US 2012/0306081 A1    Dec. 6, 2012

(30) Foreign Application Priority Data

Jun. 1, 2011   (JP) .................. 2011-123622

(51) Int. Cl.
*H01L 21/768*   (2006.01)
*H01L 23/532*   (2006.01)
(Continued)

(52) U.S. Cl.
CPC ........ *H01L 27/101* (2013.01); *H01L 21/76886* (2013.01); *H01L 21/76888* (2013.01); *H01L 23/53261* (2013.01); *H01L 23/53266* (2013.01);*H01L 21/76832* (2013.01); *H01L 21/76834* (2013.01); *H01L 21/76852* (2013.01); *H01L 21/76867* (2013.01); *H01L 21/76877* (2013.01);
(Continued)

(58) Field of Classification Search
CPC ..... H01L 23/532; H01L 21/768; H01L 21/28; H01L 23/52; H01L 21/44; H01L 21/4763

USPC ............ 438/672, 612, 618, 244, 3, 643, 238, 438/778, 623, 687, 781, 787, 790, 795; 257/E21.17, E21.28, E21.58, 296, 295, 257/310, 644, 506

See application file for complete search history.

(56) References Cited

U.S. PATENT DOCUMENTS

| | | | | |
|---|---|---|---|---|
| 5,223,455 | A * | 6/1993 | Itoh et al. ............... | 438/656 |
| 5,529,954 | A * | 6/1996 | Iijima et al. ............. | 438/653 |
| 2008/0105947 | A1* | 5/2008 | Kuzuhara et al. ........ | 257/506 |
| 2008/0146015 | A1* | 6/2008 | Usui et al. ............... | 438/608 |
| 2010/0065967 | A1* | 3/2010 | Koike et al. ............. | 257/751 |

FOREIGN PATENT DOCUMENTS

| | | |
|---|---|---|
| JP | 06-333927 | 12/1994 |
| JP | 07-066408 | 3/1995 |

(Continued)

OTHER PUBLICATIONS

First Office Action issued by Japanese Patent Office in corresponding Application No. 2011-123622 mailed Jun. 3, 2014, 13 pages.

*Primary Examiner* — David Vu
*Assistant Examiner* — Mouloucoulaye Inoussa
(74) *Attorney, Agent, or Firm* — Finnegan, Henderson, Farabow, Garrett & Dunner, LLP

(57) ABSTRACT

According to one embodiment, a semiconductor device includes an interconnect provided on a first interlayer insulating film covering a semiconductor substrate in which an element is formed, a cap layer provided on the upper surface of the interconnect, and a barrier film provided between the interconnect and a second interlayer insulating film covering the interconnect. The interconnect includes a high-melting-point conductive layer, and the width of the interconnect is smaller than the width of the cap layer. The barrier film includes a compound of a contained element in the high-melting-point conductive layer.

9 Claims, 20 Drawing Sheets

(51) Int. Cl.
*H01L 23/52* (2006.01)
*H01L 21/44* (2006.01)
*H01L 27/10* (2006.01)
*H01L 21/764* (2006.01)
*H01L 27/06* (2006.01)
*H01L 45/00* (2006.01)
*H01L 27/115* (2006.01)
*H01L 27/24* (2006.01)

(52) U.S. Cl.
CPC .......... *H01L 21/764* (2013.01); *H01L 27/0688* (2013.01); *H01L 45/06* (2013.01); *H01L 45/08* (2013.01); *H01L 45/085* (2013.01); *H01L 45/1233* (2013.01); *H01L 45/144* (2013.01); *H01L 45/146* (2013.01); *H01L 27/11524* (2013.01); *H01L 27/1157* (2013.01); *H01L 27/2409* (2013.01); *H01L 27/2436* (2013.01); *H01L 27/2463* (2013.01); *H01L 27/2481* (2013.01); *H01L 21/7682* (2013.01)
USPC ............ 257/751; 438/627; 438/643; 257/752

(56) References Cited

FOREIGN PATENT DOCUMENTS

| | | |
|---|---|---|
| JP | 09-321045 | 12/1997 |
| JP | 10-012614 | 1/1998 |
| JP | 2001-015756 | 1/2001 |
| JP | 2005-236330 | 9/2005 |
| JP | 2005-294843 | 10/2005 |
| JP | 2008-010824 | 1/2008 |
| JP | 2008-112826 | 5/2008 |
| JP | 2009-267296 | 11/2009 |

* cited by examiner

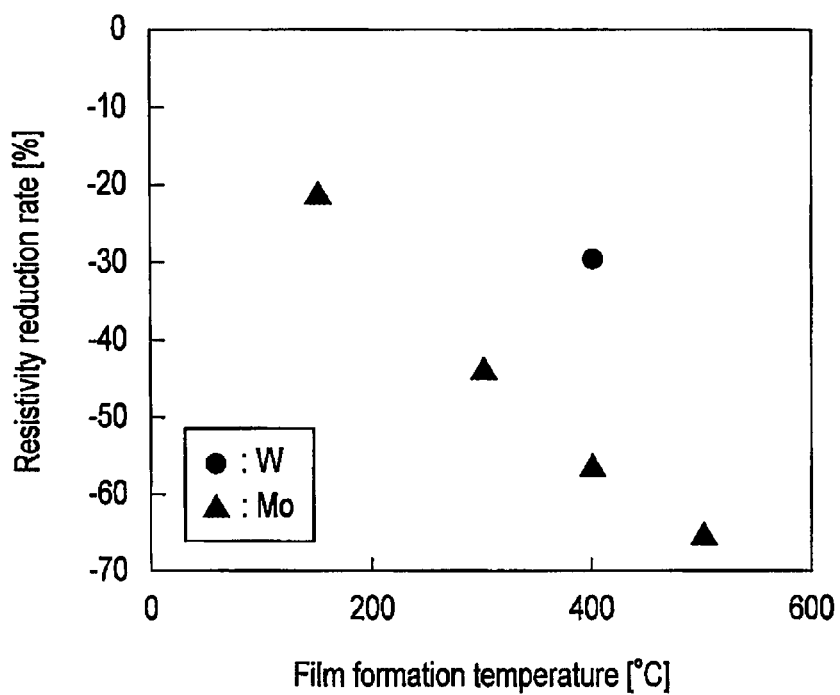
F I G. 2
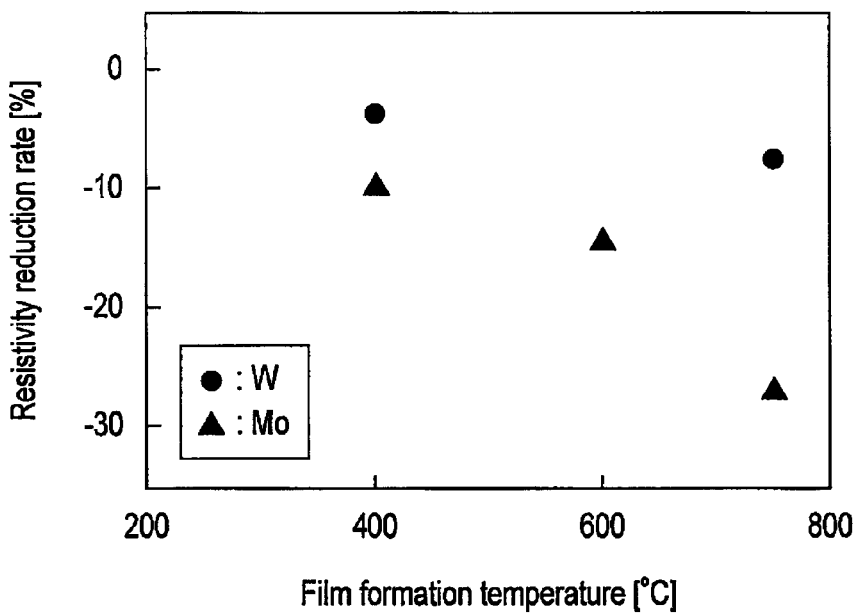
F I G. 3

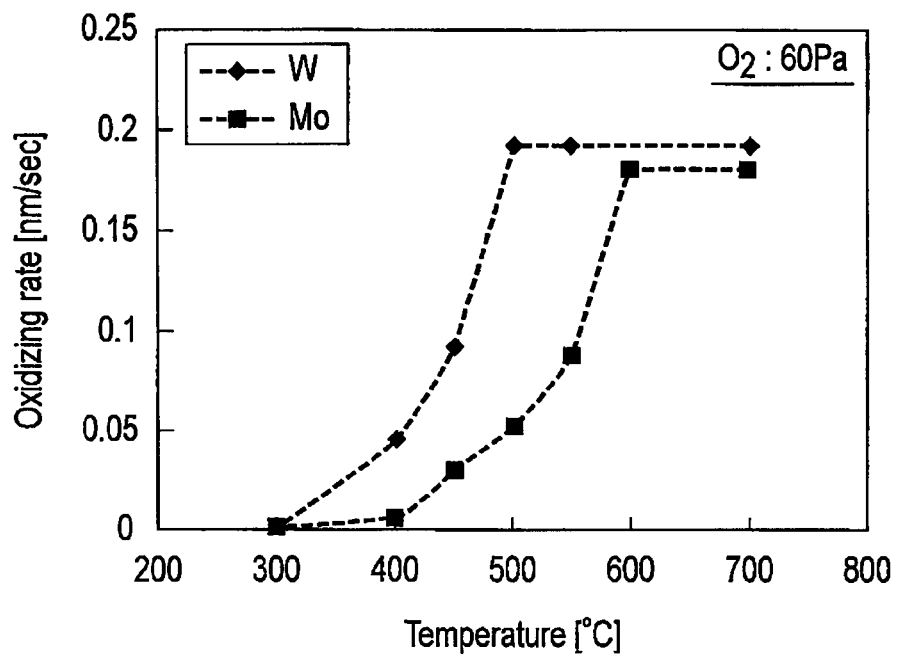
F I G. 7A
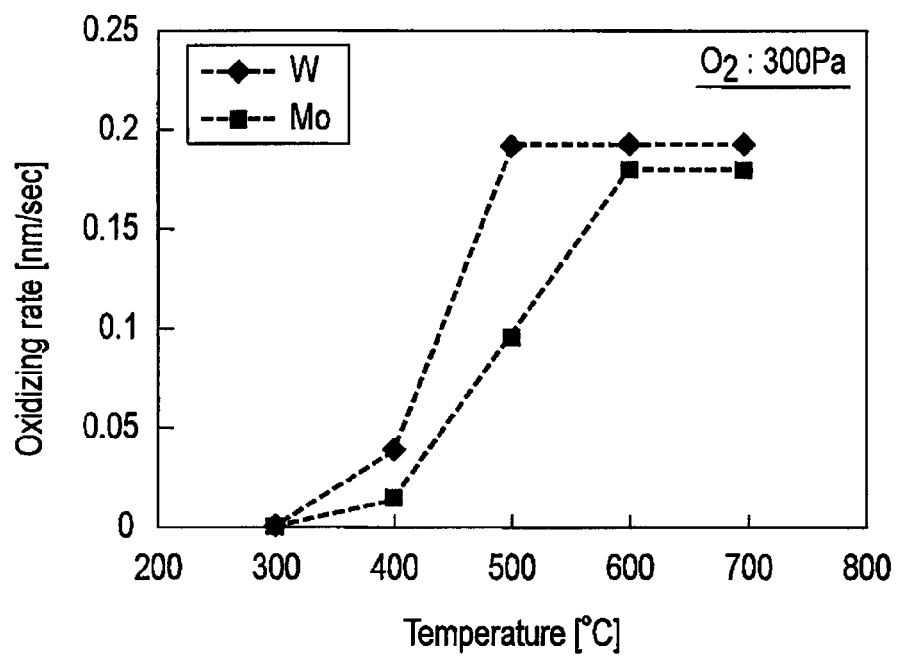
F I G. 7B

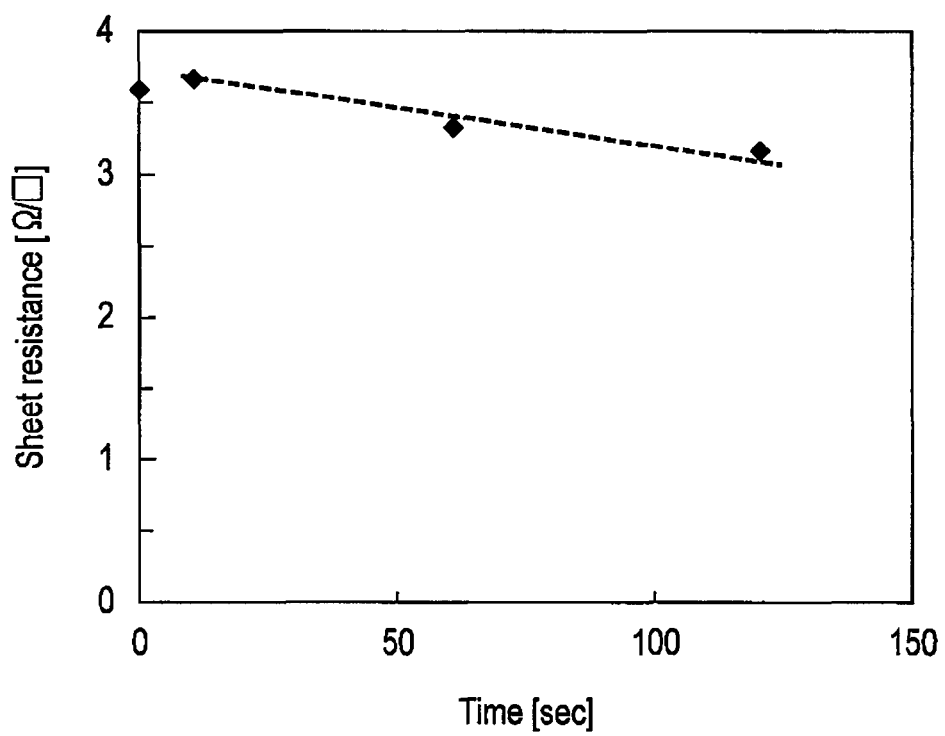
F I G. 8

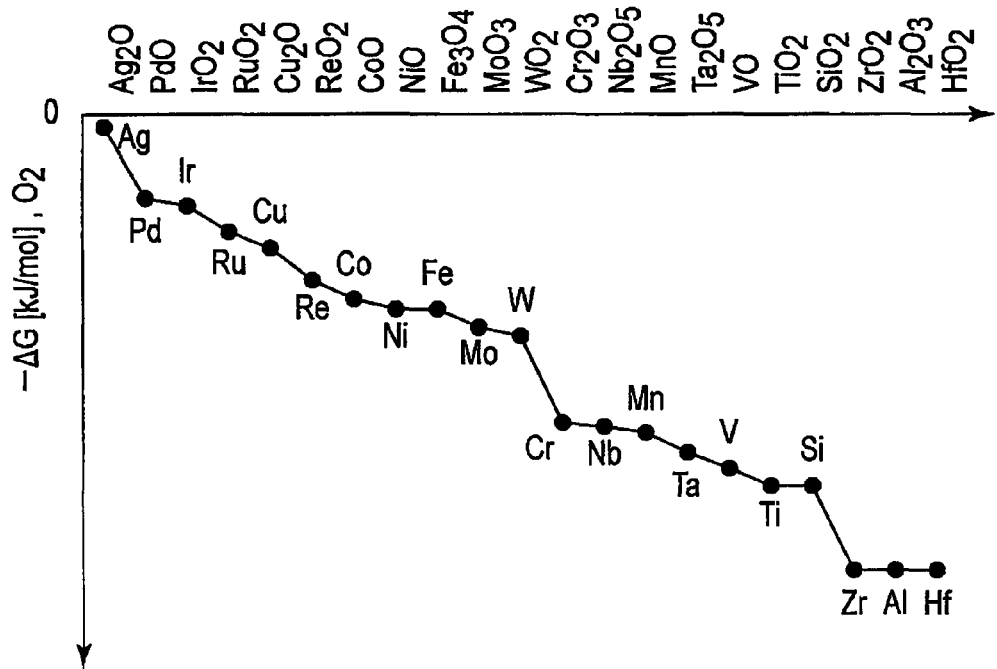
F I G. 1 1
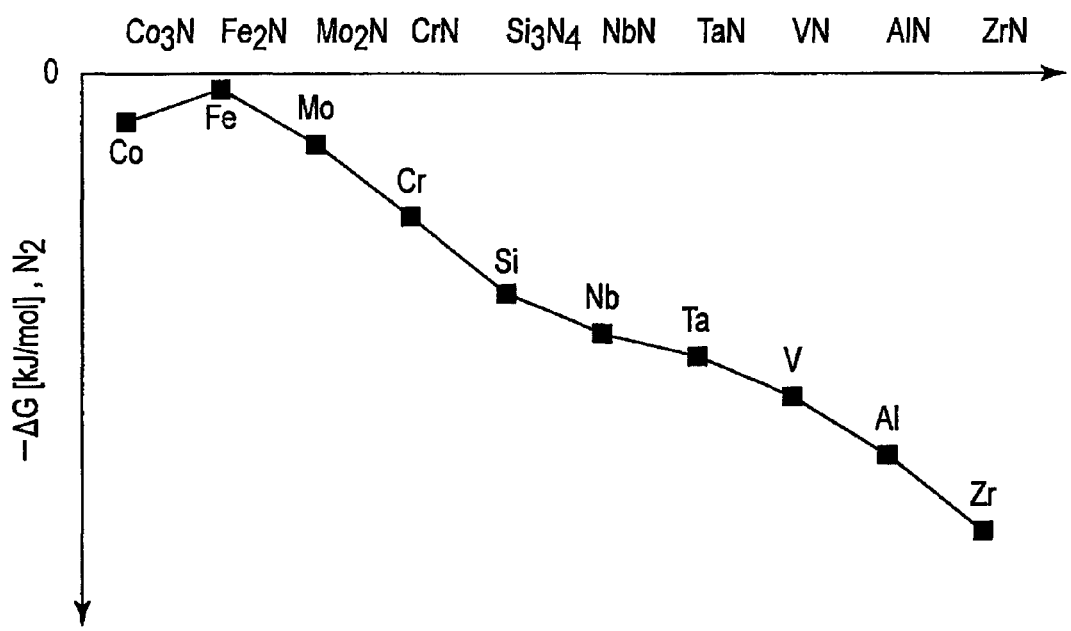
F I G. 1 2

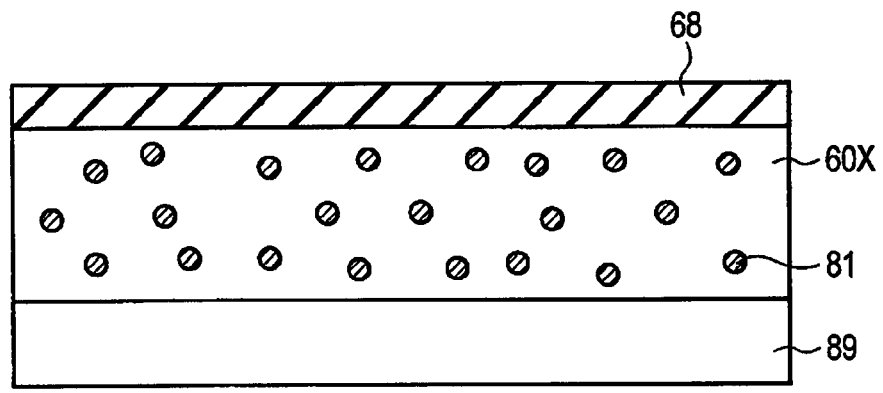
F I G. 1 3 A
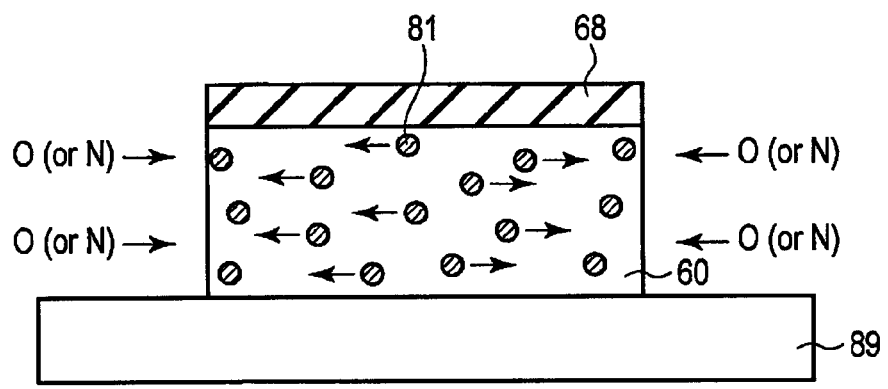
F I G. 1 3 B
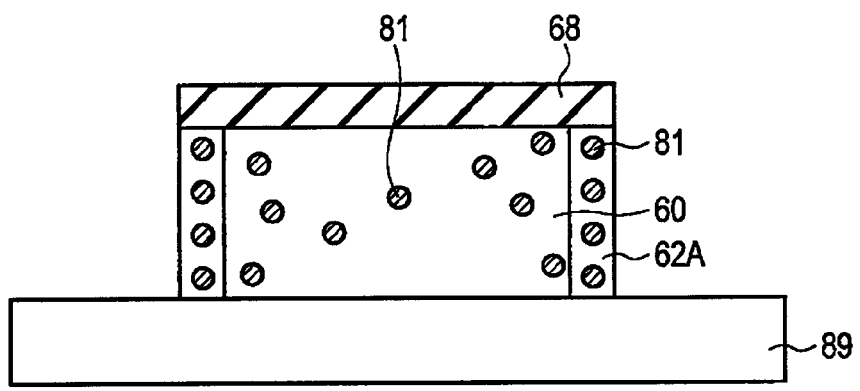
F I G. 1 3 C

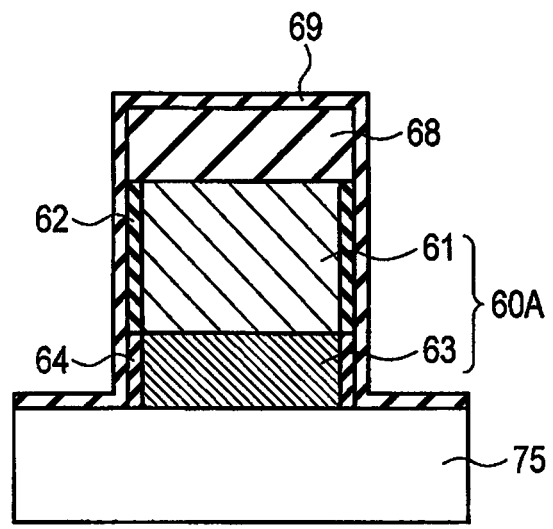
F I G. 14
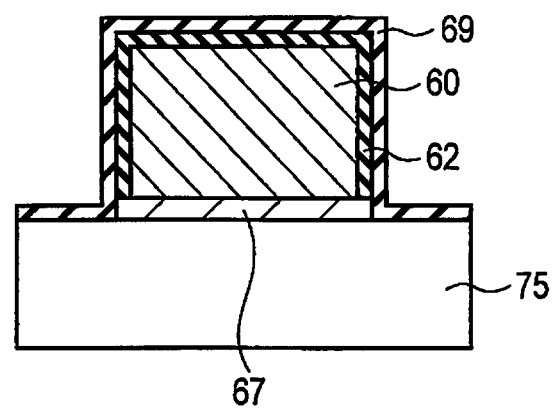
F I G. 15

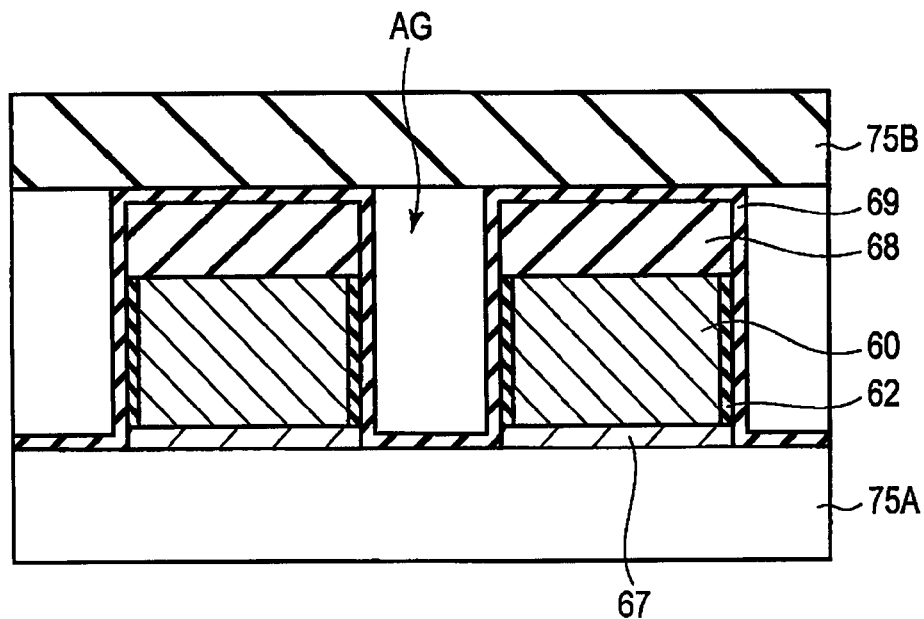
F I G. 16
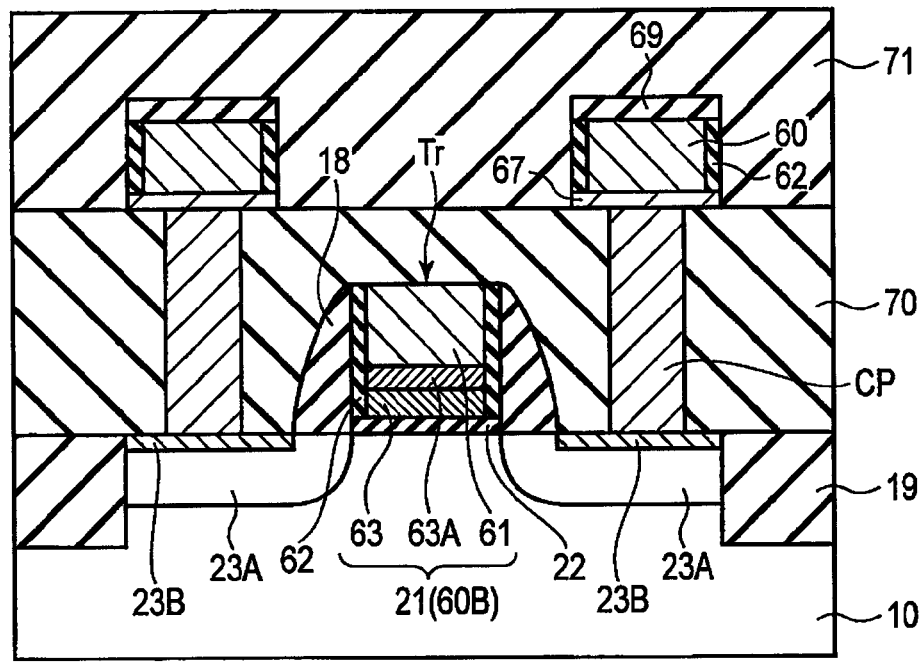
F I G. 17

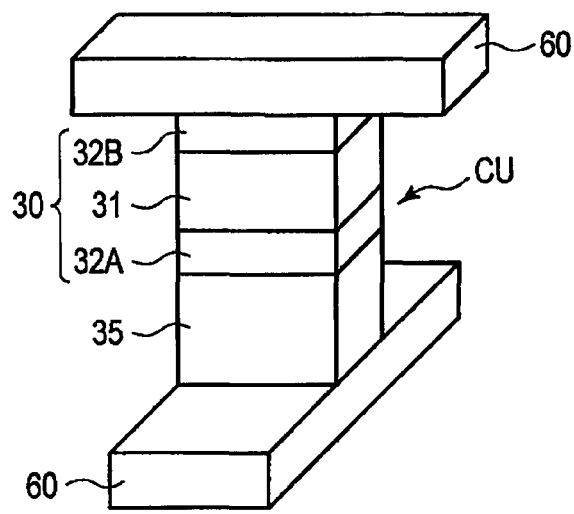
F I G. 20
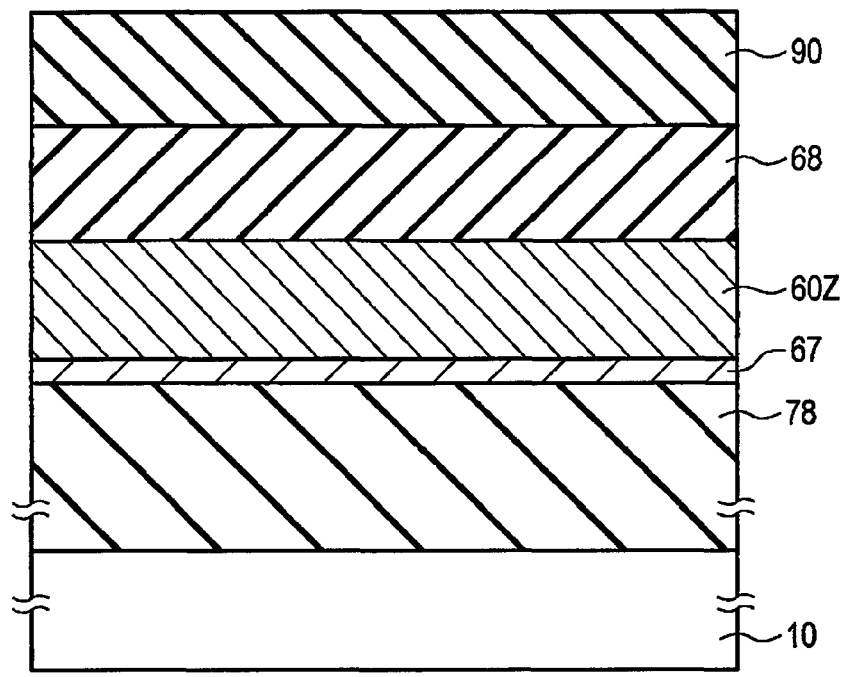
F I G. 21

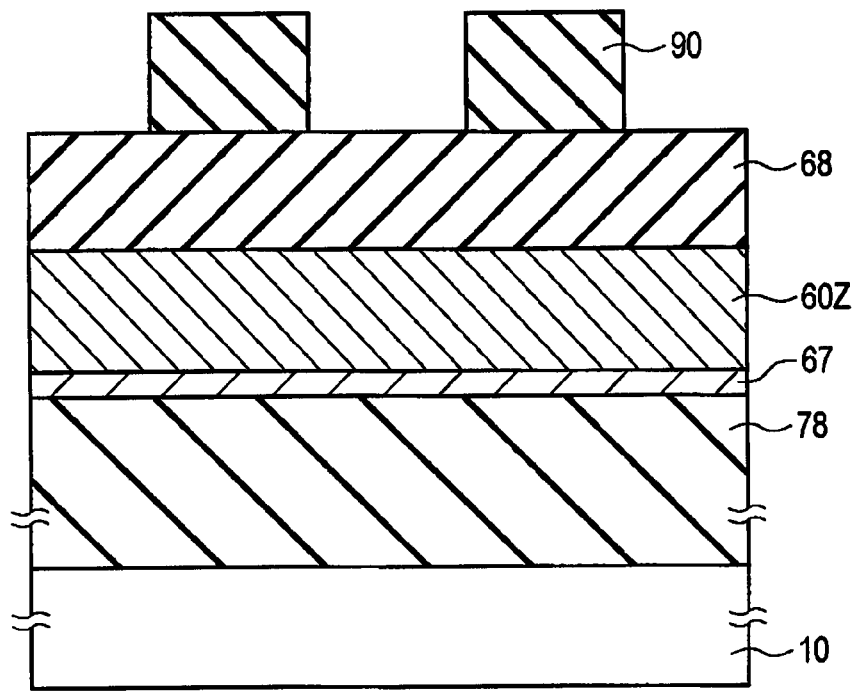
F I G. 2 2
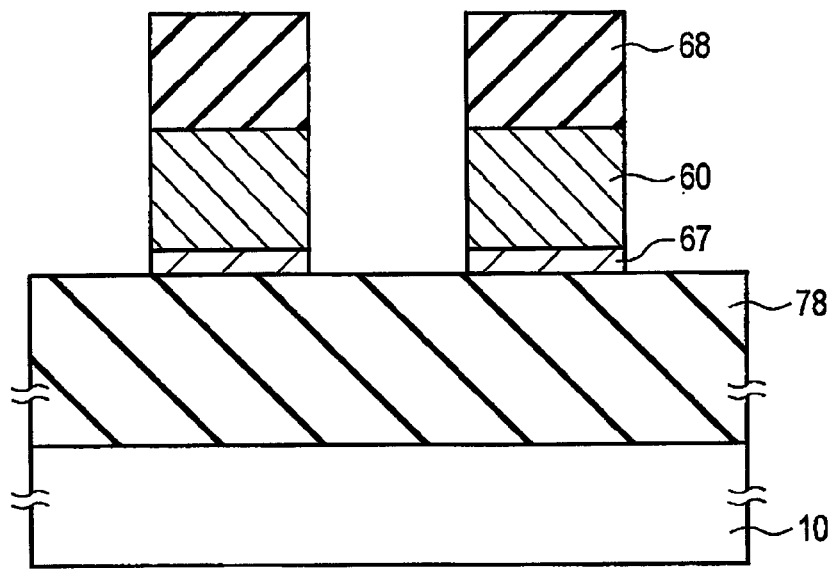
F I G. 2 3

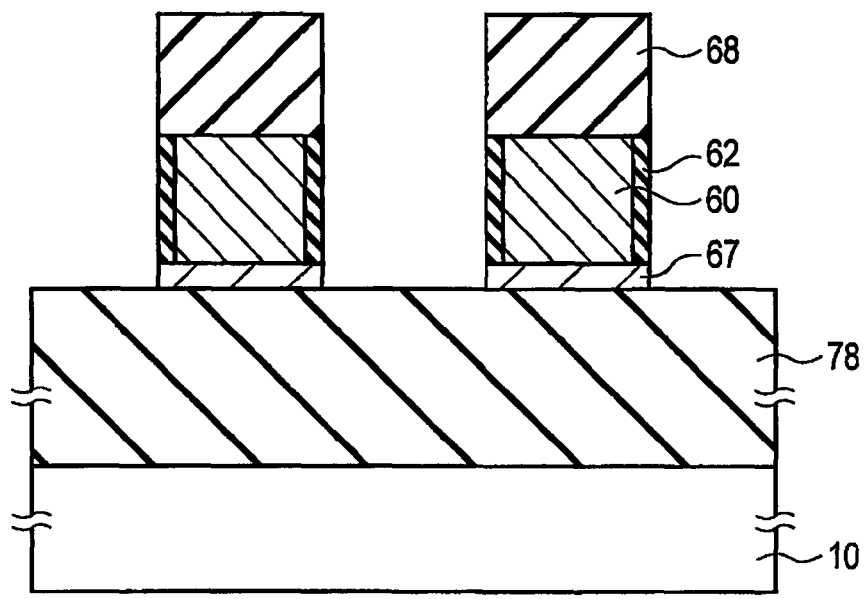
F I G. 24
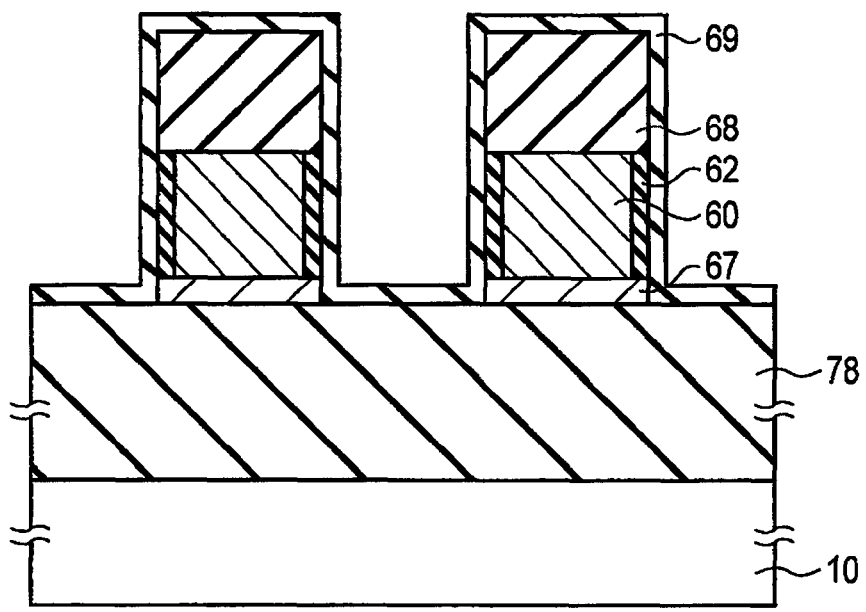
F I G. 25

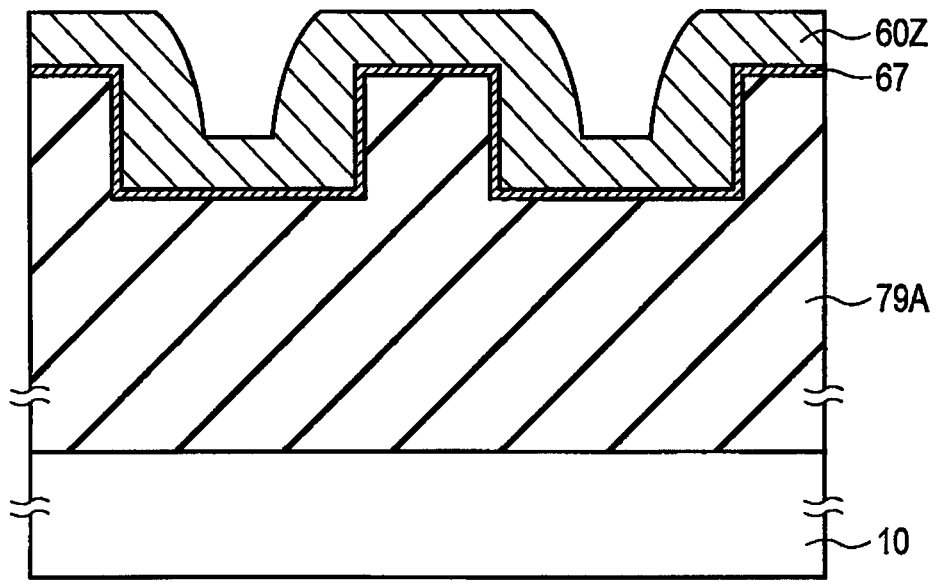
F I G. 27
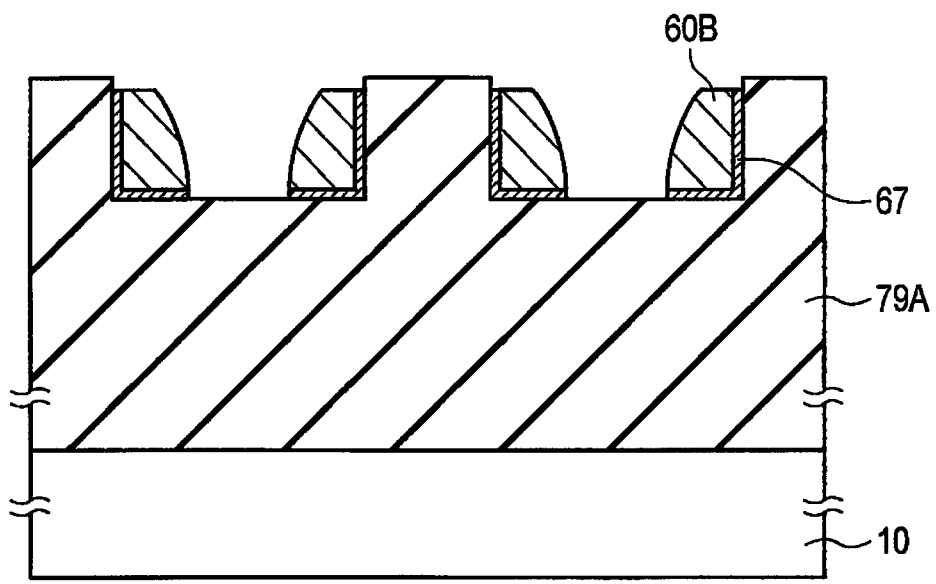
F I G. 28

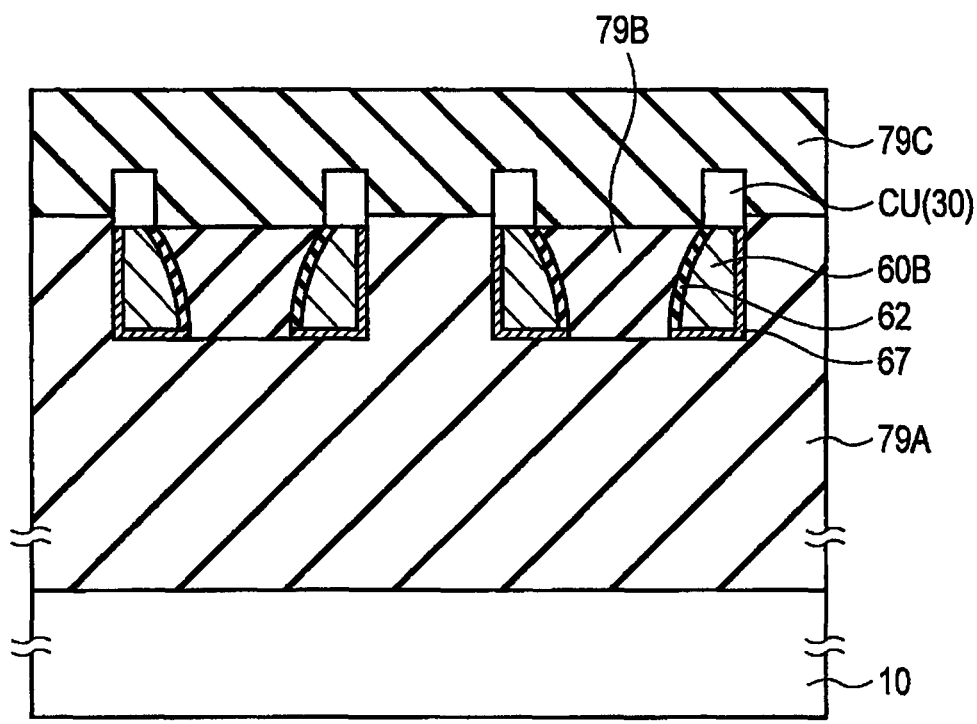
F I G. 29
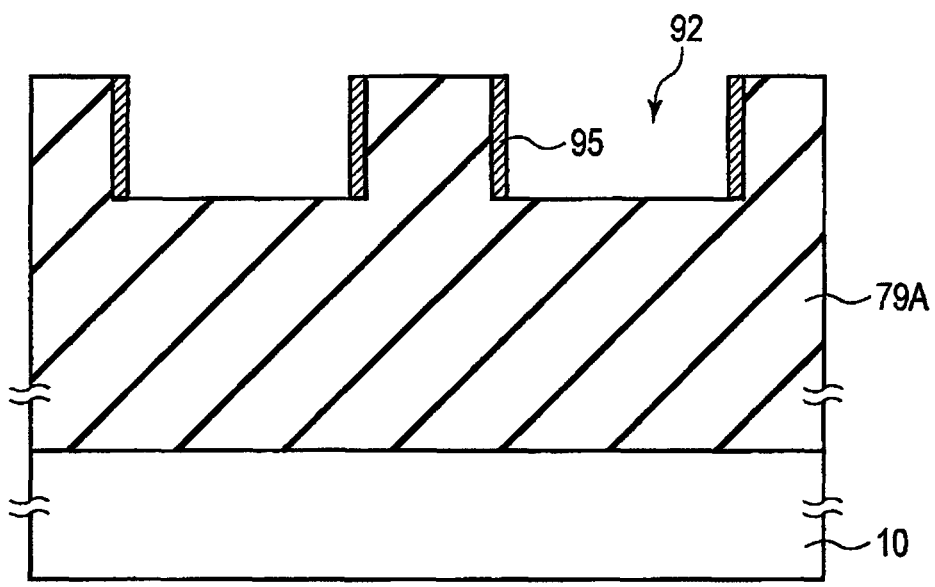
F I G. 30

SEMICONDUCTOR DEVICE AND SEMICONDUCTOR DEVICE MANUFACTURING METHOD

CROSS-REFERENCE TO RELATED APPLICATIONS

This application is based upon and claims the benefit of priority from prior Japanese Patent Application No. 2011-123622, filed Jun. 1, 2011, the entire contents of which are incorporated herein by reference.

FIELD

Embodiments described herein relate generally to a semiconductor device and a semiconductor device manufacturing method.

BACKGROUND

In interconnection in a semiconductor device, copper (Cu) is mainly used as a low-resistance interconnect material for forming interconnects (wiring lines) and vias (plugs).

In interconnect structures used in most advanced semiconductor devices, interconnects and vias are increasingly miniaturized. The miniaturization (scaling-down, shrinking) has presented the following problems in the interconnect structures: increased resistivity due to interfacial inelastic scattering of electrons, increased current density, and deteriorated reliability due to stress migration or electromigration.

Furthermore, in addition to the above problems, the size dependence of electrical resistance becomes noticeable along with the increasing miniaturization in a low-resistance interconnect material such as Cu that has a long mean free path.

Moreover, the interconnect using Cu has a damascene structure. Therefore, in addition to Cu as the interconnect material, a barrier metal film is formed in an interconnect trench (damascene trench) in which the interconnect material is embedded. As a result, an effective sectional dimension (sectional area) that contributes to the electrical conduction of the interconnect decreases as compared with the dimension of the formed interconnect trench.

In a DRAM, a flash memory, or a memory having a cross point structure, it may be preferable to use high-melting-point and low-resistance materials for a gate electrode and an interconnect of a transistor in regard to the manufacturing process of the above-mentioned memories.

BRIEF DESCRIPTION OF THE DRAWINGS

FIG. 2 is a graph illustrating a formation condition of the semiconductor device according to the embodiment;

FIG. 3 is a graph illustrating a formation condition of the semiconductor device according to the embodiment;

FIG. 7A is a graph illustrating a formation condition of the semiconductor device according to the embodiment;

FIG. 7B is a graph illustrating a formation condition of the semiconductor device according to the embodiment;

FIG. 8 is a graph illustrating a formation condition of the semiconductor device according to the embodiment;

FIG. 11 is a graph illustrating a formation condition of the semiconductor device according to the embodiment;

FIG. 12 is a graph illustrating a formation condition of the semiconductor device according to the embodiment;

FIG. 13A is a diagram illustrating a formation condition of the semiconductor device according to the embodiment;

FIG. 13B is a diagram illustrating a formation condition of the semiconductor device according to the embodiment;

FIG. 13C is a diagram illustrating a formation condition of the semiconductor device according to the embodiment;

FIG. 14 is a diagram showing a modification of the semiconductor device according to the embodiment;

FIG. 15 is a diagram showing a modification of the semiconductor device according to the embodiment;

FIG. 16 is a diagram showing a modification of the semiconductor device according to the embodiment;

FIG. 17 is a diagram showing an application of the semiconductor device according to the embodiment;

FIG. 20 is a diagram showing the application of the semiconductor device according to the embodiment;

FIG. 21 is a sectional process view showing a step in Manufacturing method 1 of the semiconductor device according to the embodiment;

FIG. 22 is a sectional process view showing a step in Manufacturing method 1 of the semiconductor device according to the embodiment;

FIG. 23 is a sectional process view showing a step in Manufacturing method 1 of the semiconductor device according to the embodiment;

FIG. 24 is a sectional process view showing a step in Manufacturing method 1 of the semiconductor device according to the embodiment;

FIG. 25 is a sectional process view showing a step in Manufacturing method 1 of the semiconductor device according to the embodiment;

FIG. 27 is a sectional process view showing a step in Manufacturing method 2 of the semiconductor device according to the embodiment;

FIG. 28 is a sectional process view showing a step in Manufacturing method 2 of the semiconductor device according to the embodiment;

FIG. 29 is a sectional process view showing a step in Manufacturing method 2 of the semiconductor device according to the embodiment; and FIG. 30 is a sectional process view showing a step in Manufacturing method 2 of the semiconductor device according to the embodiment.

DETAILED DESCRIPTION

[Embodiment]

Hereinafter, an embodiment will be described in detail with reference to FIG. 1 to FIG. 30. Elements having the same functions and configurations are provided with the same signs in the following explanation and are repeatedly described when needed.

In general, according to one embodiment, a semiconductor device includes an interconnect provided on a first interlayer insulating film covering a semiconductor substrate in which an element is formed; a cap layer provided on the upper surface of the interconnect; and a barrier film provided between the interconnect and a second interlayer insulating film covering the interconnect. The interconnect includes a high-melting-point conductive layer, and the width of the interconnect is smaller than the width of the cap layer. The barrier film includes a compound of a contained element in the high-melting-point conductive layer.

(1) Configuration

Figure 1:
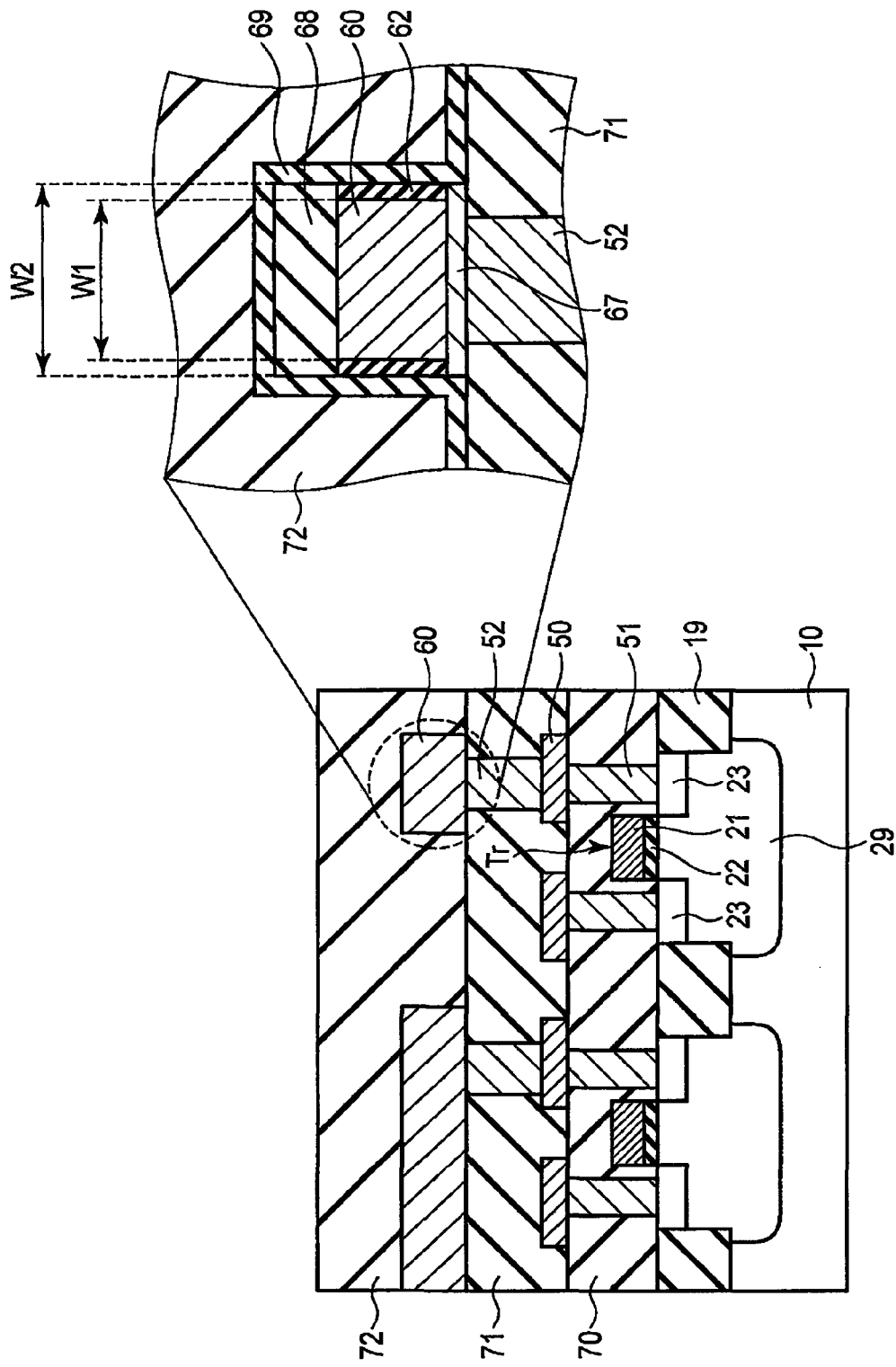
FIG. 1 is a diagram illustrating the configuration of a semiconductor device according to an embodiment.

A semiconductor device according to the present embodiment is described with reference to FIG. 1. FIG. 1 is a sectional view schematically showing the configuration of the semiconductor device according to the present embodiment.

The semiconductor device and an element Tr which forms a circuit included in the semiconductor device are provided on a semiconductor substrate 10.

In FIG. 1, a field effect transistor Tr is shown as an example of the element Tr which forms the semiconductor device. The field effect transistor is, for example, a MOS transistor.

The transistor Tr is provided in an element formation region (active region) 29 in the semiconductor substrate 10. The element formation region is surrounded by an element isolation region. A p-type or n-type well region is provided in the element formation region 29. An insulating film 19 having a shallow trench isolation (STI) structure is embedded in a trench formed in the element isolation region.

A gate electrode 21 of the transistor Tr is provided on the surface of the element formation region 29 via a gate insulating film 22. Two diffusion layers 23 as the source/drain of the transistor Tr are provided in the element formation region 29. A region between the two diffusion layers 23 in the element formation region 29 serves as a channel region of the transistor Tr. A channel (inversion layer) is formed in the surface of the channel region (under the gate insulating film 22) when a predetermined voltage is applied to the gate electrode 21.

The semiconductor device may include elements other than the field effect transistor, such as a resistive element, a capacitive element, or a memory element.

A first interlayer insulating film 70 is provided on the semiconductor substrate 10 to cover the transistor Tr. A contact plug 51 is embedded in a contact hole formed in the interlayer insulating film 70 so that the contact plug 51 is connected to the diffusion layer 23. A contact plug connected to the gate electrode 21 is also formed in the first interlayer insulating film 70.

A first interconnect (wiring line) 50 is provided on the first interlayer insulating film 70 so that the first interconnect 50 is connected to the contact plug 51. The first interconnect 50 is provided in a first interconnect level based on the height from the surface of the semiconductor substrate 10 (position in a direction perpendicular to the surface of the semiconductor substrate 10).

A second interlayer insulating film 71 is provided on the first interconnect 50 and the first interlayer insulating film 70. A via plug 52 is provided in a contact hole (via hole) formed in the second interlayer insulating film 71.

A second interconnect 60 is provided on the second interlayer insulating film 71 so that the second interconnect 60 is connected to the via plug 52. The second interconnect 60 is provided in a second interconnect level.

A third interlayer insulating film 72 is provided on the second interconnect 60 and the second interlayer insulating film 71.

Here, the structure of the interconnect used in the semiconductor device according to the present embodiment is more specifically described using the second interconnect 60.

In the semiconductor device according to the present embodiment, the second interconnect 60 is formed by using a conductive layer including a high-melting-point conductor. The high-melting-point conductor in the present embodiment is a metal or a metal compound having a melting temperature (melting point) $T_M$ of 1000° C. or more, preferably, higher than 1100° C. The high-melting-point conductor is less subject to adversely effect due to the miniaturization of the interconnect than Al or Cu. The conductive layer of the high-melting-point conductor includes one or more kinds of elements (contained elements, added elements).

A contact layer 67 is provided between the bottom (bottom surface) of the interconnect (conductive layer) 60 and the interlayer insulating film 70 and between the bottom of the interconnect 60 and the via plug 52. The contact layer 67 is provided to ensure the performance of contact between the interconnect 60 and other members. The contact layer 67 prevents the interconnect 60 from coming off the interlayer insulating film 71 and the via plug 52. The contact layer 67 also functions as, for example, a barrier metal, and prevents the diffusion of an impurity generated between the interconnect 60 and the interlayer insulating film 71 and the diffusion of an impurity generated between the interconnect 60 and the plug 52.

For example, titanium nitride (TiN) is used for the contact layer 67. However, the material of the contact layer 67 may be properly changed depending on the material of the interconnect 60. For example, when the interconnect is made of Mo, molybdenum nitride (MoN) is used as the contact layer 67.

For example, an insulating film 68 is provided on the top (upper surface) of the interconnect 60. The insulating film 68 is used as a part of a mask for fabricating the interconnect 60. The insulating film 68 is hereinafter referred to as a cap layer. The cap layer 68 is removed from the upper surface of the interconnect 60 at the formation position of the via plug which connects the interconnect 60 to the interconnect at an upper interconnect level. The cap layer 68 does not have to remain on the interconnect 60, and may be removed after the interconnect 60 is fabricated.

An insulating film 69 as a passivation film (also referred to as a spacer film) covers the interconnect (conductive layer) 60. Hereinafter, the cap layer 68 and the passivation film 69 may be explained as interlayer insulating films.

A diffusion prevention film 62 is formed along the circumference of the conductive layer 60. In the structure of the interconnects shown in FIG. 1, the diffusion prevention film 62 is provided on the side portion (side surface) of the conductive layer 60. In FIG. 1, the diffusion prevention film 62 intervenes between the conductive layer 60 and the passivation film 69. The diffusion prevention film 62 inhibits the diffusion of an oxidizing species or a nitriding species into the conductive layer 60 during the formation of the passivation film 69 and the interlayer insulating film 72. The film 62 which inhibits the diffusion of the impurity into the conductive layer 60 is hereinafter also referred to as a barrier film 62.

The barrier film 62 is an oxide or nitride of the material (interconnect material) for forming the conductive layer 60. For example, when the interconnect 60 is formed by using Mo, the barrier film 62 includes molybdenum dioxide ($MoO_2$). The barrier film 62 may otherwise be an oxynitride film or a carbide film.

For example, when the barrier film 62 is formed on the side surface of the conductive layer 60 by an oxidizing treatment or a nitriding treatment of the conductive layer 60, the width W1 of the conductive layer 60 is slightly smaller than the width W2 of the cap layer 68.

For example, the interconnect width W1 of the high-melting-point conductive layer 60 as an interconnect is set to a range of 30 nm or more to 500 nm or less depending on the interconnect pattern of the semiconductor device and the interconnect level. The interconnect width W1 of the interconnect 60 may be set to a value greater than 500 nm. The interconnect width W1 of the interconnect 60 may otherwise be set to a dimension (e.g., 20 nm or less) smaller than the critical dimension for lithographic (exposure) resolution by a micro fabrication technique such as a sidewall transfer technique.

In the semiconductor device according to the present embodiment, the interconnect 60 is formed by the conductive layer including the high-melting-point conductor. In the present embodiment, specific examples of the high-melting-point conductor for forming the interconnect 60 will be described later.

The interconnect (high-melting-point conductive layer) 60 including the high-melting-point conductor is formed by the material and formation conditions described later, so that crystal grains of the high-melting-point conductor included in the interconnect 60 are increased in size. As a result, crystal grain boundaries in a predetermined area (or a unit volume) decrease, and the scattering of electrons attributed to the crystal grain boundaries in the high-melting-point conductive layer 60 decreases. Thus, the resistance value of the interconnect 60 including the high-melting-point conductor decreases.

When the high-melting-point conductor is used for the interconnect 60, the high-melting-point conductive layer is fabricated into a predetermined pattern by etching. After the interconnect 60 is fabricated, the side surface of the high-melting-point conductive layer as the interconnect 60 is exposed, and the exposed surface of the high-melting-point conductive layer is subjected to an oxidizing atmosphere or nitriding atmosphere for forming the interlayer insulating film (or the passivation film). Therefore, when the interlayer insulating film is directly formed on the high-melting-point conductive layer, there is a fear that the electrical resistance of the interconnect may rise due to excessive oxidizing or nitriding of the conductive layer resulting from the formation of the interlayer insulating film.

In contrast, in the interconnect structure of the semiconductor device according to the present embodiment, the barrier film (diffusion prevention film) 62 is provided between the interconnect 60 and the interlayer insulating film. This prevents the oxidizing or nitriding of the high-melting-point conductive layer for forming the interconnect 60, and inhibits the rise in the resistance of the interconnect 60 attributed to the formation of the interlayer insulating film.

Furthermore, as the barrier film 62 is formed by the oxidizing treatment or nitriding treatment of the high-melting-point conductive layer 60, the interconnect width of the interconnect structure including the high-melting-point conductive layer 60 and the barrier film 62 hardly increases. Thus, a miniaturized interconnect structure can be formed.

Consequently, according to the semiconductor device of the present embodiment, the resistance of the interconnect can be reduced.

(2) Interconnect Material and Interconnect Structure Formation Conditions

The material of the interconnect 60 included in the semiconductor device according to the present embodiment and the interconnect structure formation conditions are described with reference to FIG. 2 to FIG. 13.

(a) Material

As has been described with reference to FIG. 1, the high-melting-point conductor (high-melting-point conductive layer) is used as the material (interconnect material) for forming the interconnect 60 in the semiconductor device according to the present embodiment.

In the present embodiment, for the high-melting-point conductor (a high-melting-point metal element or a first element) as the interconnect material, at least one material (element) selected from the group including molybdenum (Mo), tungsten (W), ruthenium (Ru), tantalum (Ta), cobalt (Co), and nickel (Ni) is used. These metals have a melting temperature $T_M$ of 1000° C. or more. These metals are hereinafter referred to as high-melting-point metals. As long as the high-melting-point metals as the interconnect materials have a melting temperature of 1000° C. or more; preferably, more than 1100° C., such metals are not limited to the above-mentioned metals. An alloy including the above-mentioned high-melting-point metals may be used if its melting temperature is 1000° C. or more.

The high-melting-point conductor that forms the interconnect 60 may be, for example, a metal compound If its melting temperature is 1000° C. or more. For example, a compound of the above-mentioned high-melting-point metals, more specifically, a silicide such as molybdenum silicide (MoSi), tungsten silicide (WSi), nickel silicide (NiSi), or cobalt silicide (CoSi) may be used for the metal compound (hereinafter also referred to as a high-melting-point compound) as the high-melting-point conductor.

Furthermore, it is preferable that for the high-melting-point conductor as the interconnect 60, a material having a recrystallization temperature $T_R$ of 1000° C. or less is used among the above-mentioned high-melting-point metals and high-melting-point metal compounds. The recrystallization temperature of W is 1200° C. or less. The recrystallization temperature of Ta is 1000° C. or less. The recrystallization temperature of Mo is 900° C. or less. The recrystallization temperature of Ru is 900° C. or less. Therefore, in the present embodiment, it is particularly preferable that Mo, Ru, or Ta is used for the interconnect among the above-mentioned high-melting-point metals.

If a high-melting-point metal having a recrystallization temperature of 1000° C. or less is used for the interconnect 60, the crystallinity of the interconnect 60 formed by the high-melting-point conductive layer can be improved (the crystal grains can be increased in diameter) by a relatively low heating temperature.

The above-mentioned high-melting-point conductor may be used not only for the interconnect 60 but also for the via plug 52 and the interconnect 50 shown in FIG. 1.

A semiconductor device manufacturing process includes a process having a temperature condition ranging from about 1000° C. to 1100° C. or less. In the present embodiment, the high-melting-point conductor having a melting temperature $T_M$ of 1000° C. or more is used for the interconnect 60 which connects the elements on the semiconductor substrate 10.

This high-melting-point conductor inhibits the deterioration of the interconnect caused by high heat as compared with a metal material such as Cu or Al having a relatively low melting temperature $T_M$.

When a high-melting-point conductor having a recrystallization temperature $T_R$ of 1000° C. or less is used for the interconnect 60, the crystallinity of the interconnect can be improved (the crystal grains can be increased in diameter) and the resistance of the interconnect can be reduced in the manufacturing process having the above-mentioned temperature condition.

The high-melting-point conductor for forming the interconnect is not limited to the above-mentioned metals and metal compounds. For example, a metal and metal compound such as Ti that fulfils the above-mentioned melting temperature and recrystallization temperature conditions may be used for the interconnect in the semiconductor device according to the present embodiment.

(b) Formation Conditions

The formation conditions of the interconnect included in the semiconductor device according to the present embodiment are described with reference to FIG. 2 to FIG. 5.

FIG. 2 is a graph showing the relation between the heating temperature (hereinafter referred to as film formation temperature) of the substrate and the electrical characteristics of the high-melting-point conductive layer during the deposition of the high-melting-point conductive layer as the interconnect.

In FIG. 2, the horizontal axis of the graph indicates the film formation temperature. In FIG. 2, the vertical axis of the graph indicates the interconnect resistivity reduction rate (unit: [%]) relative to the film formation temperature. FIG. 2 shows the change of the electrical characteristics of the high-melting-point conductive layer made of Mo or W. The Mo layer and the W layer are formed by a physical vapor deposition (PVD) method.

In FIG. 2, the interconnect resistivity reduction rate is found by using, as a standard (reference value), the resistivity of the Mo layer or the W layer formed at room temperature (25° C. to 30° C.) without heating the substrate. The resistivity reduction rates of the Mo layer when the substrate is heat-treated at 150° C., 300° C., 400° C., and 500° C. during the formation of the Mo layer are shown in the example in FIG. 2. The resistivity reduction rate of the W layer when the substrate is heat-treated at 400° C. during the formation of the W layer is also shown in the example in FIG. 2.

As shown in FIG. 2, the resistivities of the Mo layer and the W layer are reduced when the conductive layer (here, the Mo layer or the W layer) for forming the interconnect is deposited on the heated substrate.

In the example shown in FIG. 2, the resistivity of the W layer drops by about 30% at a film formation temperature of 400° C. as compared with the resistivity of the W layer formed at room temperature.

Moreover, in the example shown in FIG. 2, the resistivity of the Mo layer formed at a film formation temperature of 150° C. drops by about 20% as compared with the resistivity of the Mo layer formed at room temperature, and the resistivity reduction rate of the Mo layer increases as the film formation temperature rises. The resistivity of the Mo layer formed at a film formation temperature of 500° C. drops by about 60% to 70% as compared with the resistivity of the Mo layer formed at room temperature.

The resistivities of the Mo layer and the W layer formed at a film formation temperature equal to room temperature are, for example, about 15 $\mu\Omega\cdot$cm to 16 $\mu\Omega\cdot$cm at a predetermined dimension (interconnect width). The W layer shows a resistivity of about 11 $\mu\Omega\cdot$cm when the substrate is heat-treated at about 400° C. during film formation.

The Mo layer shows a resistivity of about 16 $\mu\Omega\cdot$cm when the substrate is heat-treated at about 150° C. during film formation. The Mo layer shows a resistivity of about 8 $\mu\Omega\cdot$cm when the substrate is heat-treated at about 500° C. during film formation.

Thus, the resistivities of the Mo layer and the W layer decrease along with the rise of the film formation temperature of the Mo layer and the W layer. Moreover, as the recrystallization temperature of Mo is lower than the recrystallization temperature of W, the resistivity reduction rate of the Mo layer is higher than the resistivity reduction rate of the W layer in the heating treatment during film formation.

FIG. 3 is a graph showing the relation between the heating temperature and the electrical characteristics of the interconnects (here, the Mo layer and the W layer) when the interconnects after being deposited are heat-treated (hereinafter referred to as post annealing).

In FIG. 3, the horizontal axis of the graph indicates the heating temperature of the post annealing. The heating temperature is set to about 400° C. to 800° C. In FIG. 3, the vertical axis of the graph indicates the resistivity reduction rate (unit: [%]) of the conductive layer which has been subjected to the post annealing. Here, the conductive layer is formed at a film formation temperature equal to room temperature (25° C. to 30° C.), and the resistivity of the conductive layer which has not been subjected to the post annealing is used as a standard (reference value).

In the example shown in FIG. 3, the resistivity reduction rate of the Mo layer when the Mo layer deposited at room temperature is subjected to the post annealing at 400° C., 600° C., and 750° C. is shown. The resistivity reduction rate of the W layer when the W layer deposited at room temperature is subjected to the post annealing at 400° C. and 750° C. is also shown. As in the example shown in FIG. 2, the Mo layer and the W layer are deposited on the substrate by the PVD method.

As shown in FIG. 3, the resistivities of the Mo layer and the W layer decrease when the deposited layers are subjected to the post annealing.

The resistivity of the W layer decreases by about 4% to 10% due to the post annealing at 400° C. to 750° C. as compared with the W layer that is not subjected to the post annealing. For example, the W layer which has been subjected to the post annealing at 400° C. to 750° C. shows a resistivity of about 11 $\mu\Omega\cdot$cm to 12 $\mu\Omega\cdot$cm.

The resistivity of the Mo layer decreases by about 10% due to the post annealing at 400° C., and decreases by about 15% due to the post annealing at 600° C. When the Mo layer is subjected to the post annealing at 750° C., the resistivity of the Mo layer decreases by about 27% as compared with the Mo layer that is not subjected to the post annealing. For example, the Mo layer which has been subjected to the post annealing at 400° C. to 750° C. shows a resistivity of about 8 $\mu\Omega\cdot$cm to 10 $\mu\Omega\cdot$cm. As described above, as the recrystallization temperature of Mo is relatively low, the increase in the grain diameter of crystal included in the Mo layer is accelerated, and the resistivity reduction rate of the Mo layer becomes higher than the resistivity reduction rate of the W layer.

Thus, the resistivity of the high-melting-point conductive layer can be reduced by the post annealing after film formation as in the heating of the substrate during film formation.

The formation conditions of the interconnect formed by the high-melting-point conductive layer when the PVD method is used are described with reference to FIG. 4 and FIG. 5. FIG.

Figure 5:
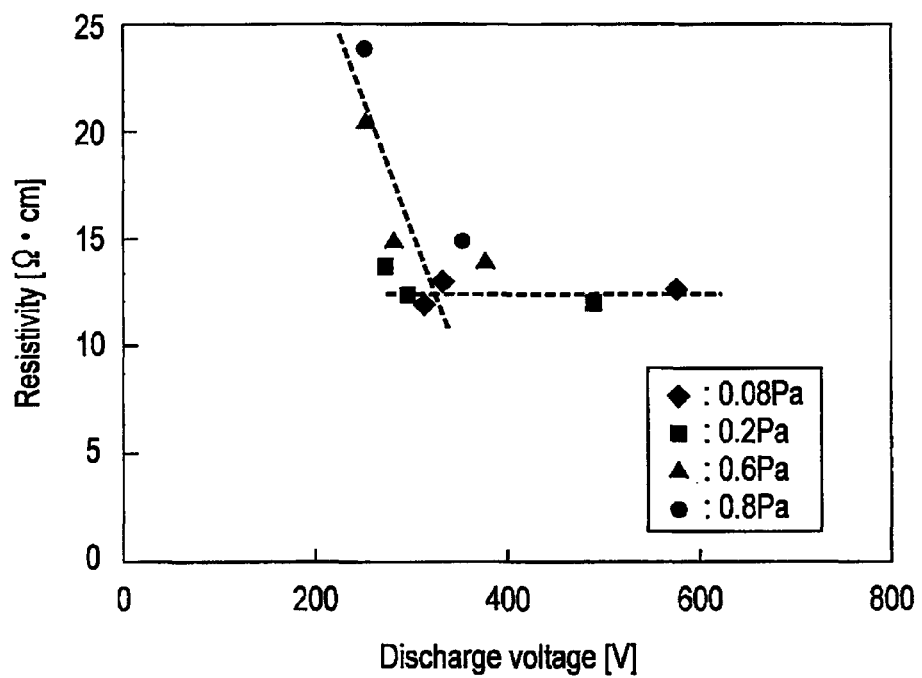
FIG. 5 is a graph illustrating a formation condition of the semiconductor device according to the embodiment.

4 and FIG. 5 show conditions when a sputtering method is used for the formation of the high-melting-point conductive layer.

Figure 4:
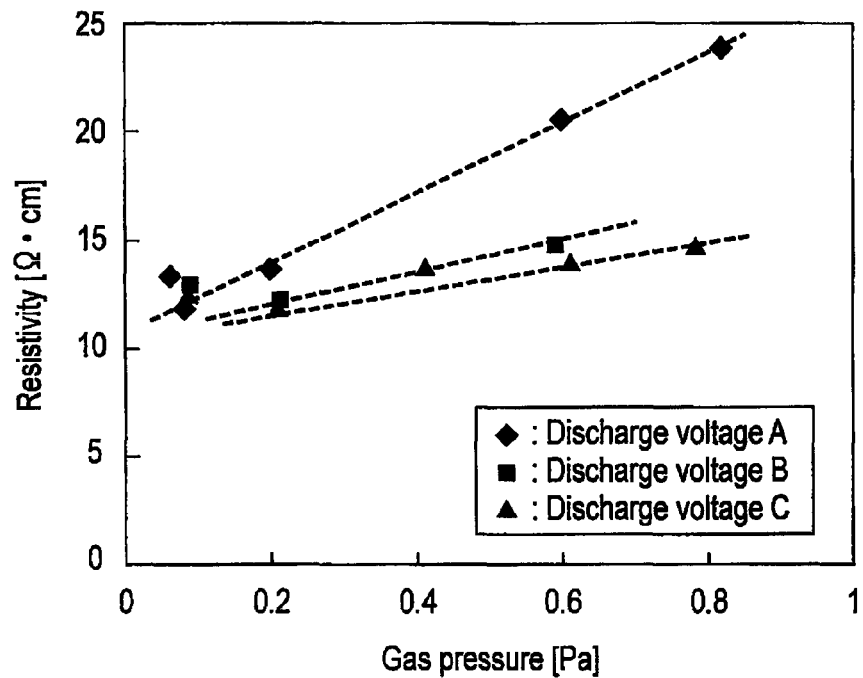
FIG. 4 is a graph illustrating a formation condition of the semiconductor device according to the embodiment.

FIG. 4 is a graph showing the relation between the pressure of a gas enclosed during the deposition of the high-melting-point conductive layer and the resistivity of the high-melting-point conductive layer. In FIG. 4, the horizontal axis of the graph indicates the pressure of a sputtering gas. In FIG. 4, the vertical axis of the graph indicates the resistivities of the conductive layers (here, the W layers) formed at various gas pressures. In FIG. 4, argon (Ar) is used for the sputtering gas. The pressure of the Ar gas shown in FIG. 4 is set to a range of about 0.08 Pa to 0.8 Pa. In FIG. 4, discharge voltages (sputtering power) are changed to measure the change of the resistivity of the interconnect relative to the gas pressure. In FIG. 4, of three discharge voltages A, B, and C, the discharge voltage C is highest, the discharge voltage A is lowest, and the discharge voltage B is set to a level between the discharge voltage A and the discharge voltage C.

FIG. 5 is a graph showing the relation between the discharge voltage during the deposition of the high-melting-point conductive layer and the resistivity of the high-melting-point conductive layer. In FIG. 5, the horizontal axis of the graph indicates the discharge voltage for forming the high-melting-point conductive layer (here, the W layer). In FIG. 5, the vertical axis of the graph indicates the resistivity of the high-melting-point conductive layer. In FIG. 5, the discharge voltages are set to a range of 250 V to 600 V, and the conductive layers are thus deposited. FIG. 5 shows the change of the resistivity of the high-melting-point conductive layer relative to the discharge voltages when the pressure of the Ar gas as the sputtering gas is set to 0.08 Pa, 0.2 Pa, 0.6 Pa, and 0.8 Pa.

As shown in FIG. 4, the resistivities of the high-melting-point conductive layers formed by the respective discharge voltages are reduced if the pressure of the Ar gas during sputtering is reduced. The resistivity of the conductive layer is thus reduced in response to the decrease of the pressure of the sputtering gas during film formation because the gas components taken into the conductive layer are reduced. The reduction of the gas pressure allows the discharge voltage for sputtering to be higher. Therefore, when the high-melting-point conductive layer as the interconnect is deposited, reducing the gas pressure in a chamber during film formation is effective in reducing the resistivity of the interconnect.

As shown in FIG. 5, when the discharge voltage for sputtering is less than 300 V, the dependence of the discharge voltage on the resistivity of the high-melting-point conductive layer is higher. In contrast, when the discharge voltage is 300 V or more, the change of the resistivity of the conductive layer shows the tendency to be saturated. If the conductive layer is deposited by using a discharge voltage of 300 V or more, the resistivity of the interconnect can be less than in the conductive layer formed by a discharge voltage of less than 300 V.

Therefore, when the high-melting-point conductive layer as the interconnect is deposited by the sputtering method, setting a discharge voltage of 300 V or more is effective in reducing the resistivity of the interconnect.

Although the W layer is illustrated as the conductive layer for forming the interconnect in FIG. 4 and FIG. 5, substantially the same tendency is shown when Mo or other high-melting-point metals are deposited by the sputtering method.

It is preferable for the reduction of the resistance in the interconnect to take the pressure of the sputtering gas and the discharge voltage for sputtering into consideration as shown in FIG. 4 and FIG. 5 when the high-melting-point conductive layer for forming the interconnect is deposited by the sputtering method.

It is also preferable to reduce the fabricated high-melting-point conductive layer to remove a native oxide film, in addition to the above-mentioned formation conditions and formation process. This makes it possible to prevent the decrease of the interconnect width and reduce the resistance of the interconnect. The reduction treatment can be conducted in the same process as the post annealing of the high-melting-point conductive layer.

As described above, the semiconductor device according to the present embodiment includes the interconnect 60 formed by the high-melting-point conductor.

As shown in FIG. 2 and FIG. 3, regarding the interconnects (here, the Mo layer and the W layer) 60 formed by using the high-melting-point conductor, the resistivity of the high-melting-point conductive layer 60 is reduced by applying heat to the high-melting-point conductive layer 60 as in the substrate heating during film formation or post annealing after film formation.

Due to the heat treatment for the conductive layer, the crystal grains in the high-melting-point conductive layer are grown by the applied heat, so that the size (diameter) of the crystal grains increases, and grain boundaries in the high-melting-point conductive layer are reduced. As a result, the scattering of electrons in the surface of the interconnect and the crystal grain boundaries is reduced in the micro (nanoscale) interconnect, and the resistivity (resistance value) of the high-melting-point conductive layer is reduced.

The resistivity reduction rate of the Mo layer associated with heating is higher than the resistivity reduction rate of the W layer. This is attributed to the fact that the generation and growth of the crystal nucleus of Mo are accelerated as compared with W, and Mo tends to be larger in grain diameter than W because the recrystallization temperature (about 1000° C.) of Mo is lower than the recrystallization temperature (about 1200° C.) of W. It is therefore preferable that the recrystallization temperature of the high-melting-point conductor used for the interconnect is 1000° C. or less.

Thus, heat is applied during or after the formation of the high-melting-point conductive layer, such that the crystal grains included in the interconnect formed by the high-melting-point conductor can be larger, and the resistance of the interconnect can be reduced.

When the interconnect of the high-melting-point conductor is formed by the sputtering method as described above, the electrical resistance of the interconnect can be reduced by setting conditions such as the gas pressure and the discharge voltage to proper values.

Although Mo or W is used as the high-melting-point conductor for forming the interconnect in the case described with reference to FIG. 2 to FIG. 5, substantially the same advantageous effects can also be obtained when a high-melting-point metal such as Ru or Ta or a silicide is used as far as the manufacturing process and formation conditions described above are applicable.

As described above, according to the semiconductor device of the present embodiment, the resistance of the interconnect can be reduced.

(c) Formation Conditions of Interlayer Insulating Film

The formation conditions of the interlayer insulating film in the semiconductor device according to the present embodiment are described with reference to FIG. 6A, FIG. 6B, FIG. 7A, and FIG. 7B.

When the interlayer insulating film is formed, the exposed surface of the fabricated interconnect is subjected to a source gas, gas atmosphere, and temperature conditions for forming the interlayer insulating film. Therefore, under the formation conditions of the interlayer insulating film, the exposed surface of the interconnect may cause a chemical reaction, for example, the surface may be oxidized or nitrided, and an insulating film may be formed on the surface of the interconnect. If the interconnect is excessively oxidized or nitrided, the width of the interconnect that contributes to conductivity is reduced, and the resistance value of the interconnect significantly rises. In order to inhibit the rise in the resistance of the interconnect attributed to the formation of the interlayer insulating film, it is preferable to form the interlayer insulating film under a condition in which the interconnect does not easily oxidize or nitridize.

Figure 6A:
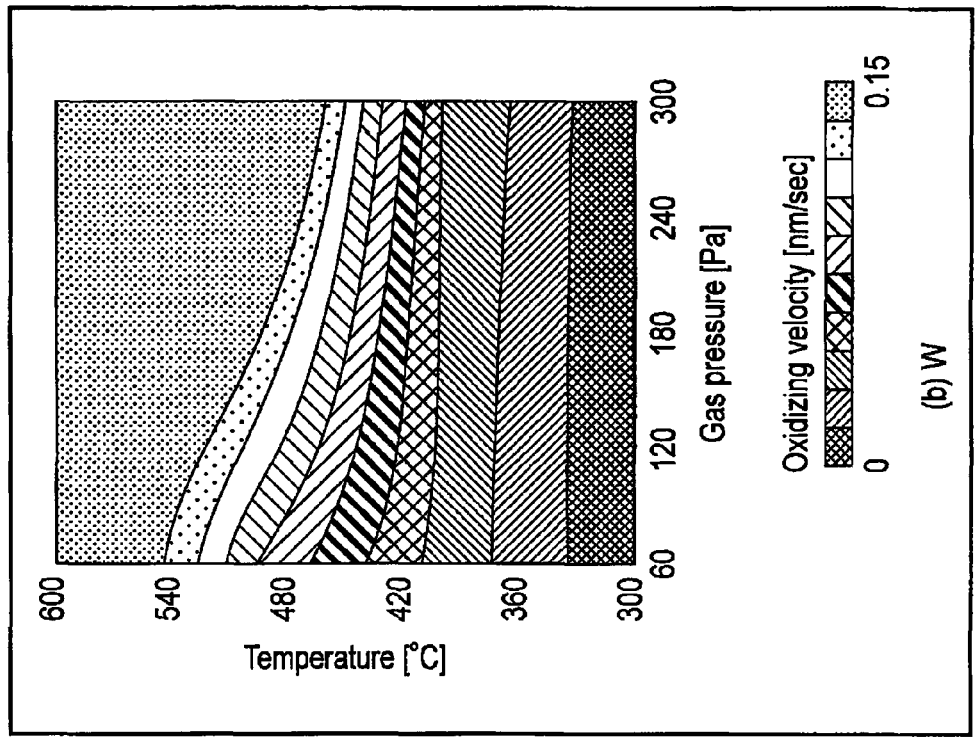
FIG. 6A is a graph illustrating a formation condition of the semiconductor device according to the embodiment.
Figure 6B:
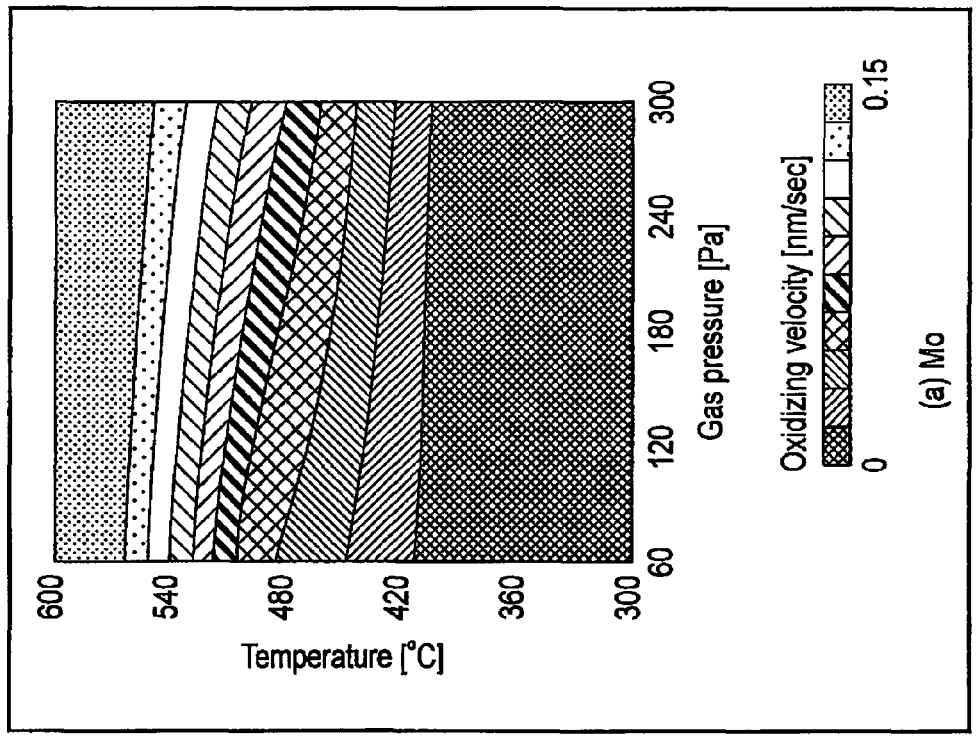
FIG. 6B is a graph illustrating a formation condition of the semiconductor device according to the embodiment.

FIG. 6A and FIG. 6B show two-dimensional maps illustrating the oxidizing velocity of the high-melting-point conductor. FIG. 6A shows the oxidizing velocity (oxidizing rate) of Mo. FIG. 6B shows the oxidizing velocity of W. In FIG. 6A and FIG. 6B, the horizontal axes of the graphs indicate the oxygen ($O_2$) gas pressure (unit: [Pa]), and the vertical axes of the graphs indicate the heating temperature (unit: [° C.]). The oxidizing velocities of Mo and W are substantially equivalent to the formation velocities of an Mo oxide film and a W oxide film.

FIG. 7A and FIG. 7B are graphs showing the relation between the oxidizing velocity of the high-melting-point conductor and the heating temperature (annealing temperature). FIG. 7A shows the relation between the oxidizing velocities of Mo and W and the heating temperature when the $O_2$ gas pressure is set to 60 Pa. FIG. 7B shows the relation between the oxidizing velocities of Mo and W and the heating temperature when the $O_2$ gas pressure is set to 300 Pa. In FIG. 7A and FIG. 7B, the horizontal axes of the graphs indicate the heating temperature, and the vertical axes of the graphs indicate the oxidizing velocities.

As shown in FIG. 6A to FIG. 7B, the oxidizing velocities of the Mo layer and the W layer significantly increase when the heating temperature under oxidizing atmosphere increases. Moreover, as shown in FIG. 6A to FIG. 7B, the oxidizing of the Mo layer and the W layer tends to be accelerated when the pressure of the $O_2$ gas used for the oxidizing treatment increases. As shown in FIG. 6A to FIG. 7B, W is more easily oxidized than Mo.

As shown in FIG. 6A and FIG. 7A, when the Mo layer is heat-treated at 600° C. under an $O_2$ gas pressure of 60 Pa, the Mo layer shows an oxidizing velocity of 0.15 nm/sec or more. In accordance with this oxidizing velocity, an Mo oxide film is formed on the surface (exposed surface) of the Mo layer. Moreover, as shown in FIG. 6A and FIG. 7B, when the Mo layer is heat-treated at 600° C. under an $O_2$ gas pressure of 300 Pa, the Mo layer shows an oxidizing velocity of 0.15 nm/sec or more. In accordance with this oxidizing velocity, an Mo oxide film is formed.

On the other hand, as shown in FIG. 6A, FIG. 7A, and FIG. 7B, when the Mo layer is heat-treated at about 450° C., the Mo layer shows an oxidizing velocity of about 0.01 to 0.03 nm/sec at an $O_2$ gas pressure of 60 Pa to 300 Pa.

When the Mo layer is heat-treated at about 400° C., the oxidizing velocity of Mo is about 0 nm/sec, nearly independently of the $O_2$ gas pressure, and almost no Mo oxide film is formed on the surface of the Mo layer.

As shown in FIG. 6B and FIG. 7A, when the W layer is heat-treated at 450° C. or more under an $O_2$ gas pressure of 60 Pa, the W layer shows an oxidizing velocity of 0.10 nm/sec or more. In accordance with this oxidizing velocity, a W oxide film is formed on the surface (exposed surface) of the W layer. Similarly, as shown in FIG. 6B and FIG. 7B, when the substrate on which the W layer is formed is heat-treated at 450° C. or more under an $O_2$ gas pressure of 300 Pa, a W oxide film is formed at an oxidizing velocity of 0.10 nm/sec or more. When the substrate on which the W layer is formed is heat-treated at about 400° C., the oxidizing velocity is 0.05 nm/sec or less. At a heating temperature of 320° C. or less, the oxidizing velocity of W is substantially 0 nm/sec. Thus, W shows the tendency to be more easily oxidized than Mo under the conditions shown in FIG. 6A, FIG. 6B, FIG. 7A, and FIG. 7B.

If the width of the interconnect is reduced by oxidizing, the resistance value of the interconnect increases. It is therefore preferable that the interconnect is not oxidized by the oxidizing atmosphere during the formation of the interlayer insulating film. Accordingly, for example, when the high-melting-point conductive layer as the interconnect is an Mo layer, the temperature to form the interlayer insulating film is preferably 400° C. or less. The $O_2$ gas pressure (total pressure or partial pressure) to form the interlayer insulating film that covers the Mo layer is preferably 60 Pa or less. When the high-melting-point conductive layer as the interconnect is a W layer, the temperature to form the interlayer insulating film is preferably 330° C. or less. The $O_2$ gas pressure (total pressure or partial pressure) to form the interlayer insulating film that covers the W layer is preferably 60 Pa or less.

The interlayer insulating film is formed under the oxidizing atmosphere in the case described here. However, for example, when the interlayer insulating film (cap layer or passivation film) is formed under nitriding atmosphere, it is likewise preferable that the formation temperature (substrate heating temperature) of the interlayer insulating film and $N_2$ gas pressure are properly set in consideration of the nitriding velocity of the high-melting-point conductor.

However, the formation temperature of the interlayer insulating film has only to be 400° C. or less in at least the initial stage of the formation of the interlayer insulating film, for example, in a period from the start of the formation of the interlayer insulating film to the coverage of the interconnect formed by the high-melting-point conductive layer (e.g., Mo layer) with the interlayer insulating film. Therefore, the process of forming the interlayer insulating film may be divided into two stages so that a thick interlayer insulating film may be formed on the interconnect under a temperature condition of more than 400° C. after a thin interlayer insulating film is formed on the interconnect under a temperature condition of 400° C. or less. This makes it possible to avoid the prolongation of a manufacturing period and reduce the resistance of the interconnect.

In the case described here, Mo and W are used for the high-melting-point conductive layer as the interconnect. However, when the high-melting-point conductive layer is formed by Ru, Ta, or a silicide, the formation temperature of the interlayer insulating film and the gas pressure can be properly set to conditions that inhibit the oxidizing and nitriding of the conductive layer, in consideration of the oxidizing and nitriding reaction of the conductive layer, more specifically, the oxidizing velocity or nitriding velocity of the conductive layer. This makes it possible to inhibit the rise in the resistance of the interconnect attributed to the formation of the interlayer insulating film even when the interconnect is formed by a high-melting-point conductor other than Mo and W.

For example, SiN, $SiO_2$, SiOC, or SiCN is properly selected for the interlayer insulating film in accordance with the design of a capacitance generated between the interconnects. When the interlayer insulating film includes nitrogen or carbon, the formation temperature of the interlayer insulating film and the gas pressure that include conditions to inhibit the nitriding and carbonization of the high-melting-point conductive layer can be properly set in consideration of the nitriding velocity or carbonizing velocity of the high-melting-point conductive layer.

As described above, the formation conditions of the interlayer insulating film are set in consideration of the velocity of a reaction between the gas for forming the interlayer insulating film and the high-melting-point conductive layer. This makes it possible to inhibit the rise in the resistance value of the high-melting-point conductive layer as the interconnect and contribute to the reduction in the resistance of the interconnect.

(d) Barrier Film and its Formation Conditions

The barrier film provided on the high-melting-point conductive layer as the interconnect and its formation conditions are described with reference to FIG. 8 to FIG. 13.

As shown in FIG. 1, in the semiconductor device, the interlayer insulating films 68, 69, and 71 including nitride films and oxide films are formed over the interconnect 60 after the interconnect (high-melting-point conductive layer) 60 is formed. As described above, the exposed surface of the fabricated interconnect 60 is subjected to an oxidizing atmosphere or nitriding atmosphere during the formation of the interlayer insulating films 68, 69, and 71, and the exposed part of the interconnect 60 may be oxidized or nitrided. As shown in FIG. 1, the barrier film (diffusion prevention film) 62 is provided on the side surface of the high-melting-point conductive layer 60 as the interconnect, such that the diffusion of an oxidizing species or a nitriding species into the interconnect during the formation of the interlayer insulating film can be inhibited. The barrier film 62 is formed by, for example, an oxide film, a nitride film, or an oxynitride film.

FIG. 8 is a graph showing the relation between the processing time for forming the barrier film and the change in the resistance value of the high-melting-point conductive layer. In FIG. 8, the horizontal axis of the graph indicates the formation time (unit: [sec]) of the barrier film. In FIG. 8, the vertical axis of the graph indicates the sheet resistance (unit: [Ω/□]) of the metal layer. The barrier film is formed by the chemical treatment (here, oxidizing treatment) of the exposed surface of the high-melting-point conductive layer. When the barrier film is formed by the oxidizing treatment, there is a correlation between the formation time of the barrier film and the thickness of the barrier film to be formed. If the formation time of the barrier film is longer, the thickness of the barrier film is larger.

The example in FIG. 8 shows the changes of the sheet resistance of the high-melting-point conductive layer when barrier films are formed on the high-melting-point conductive layer in processing times of 10 sec, 60 sec, and 120 sec and when no barrier film is formed on the high-melting-point conductive layer (i.e., the formation time of the barrier film is zero).

In each of the samples in FIG. 8, a silicon nitride film having a thickness of about 5 nm is formed on the high-melting-point conductive layer after the barrier film is formed in each formation time. In FIG. 8, an Mo layer having a thickness of about 50 nm is used for the high-melting-point conductive layer.

As shown in FIG. 8, the sheet resistance of the high-melting-point conductive layer (Mo layer) on which the barrier film is formed is lower than the sheet resistance of the high-melting-point conductive layer on which no barrier film is formed. This is attributed to the barrier film which inhibits the diffusion of a nitriding species into the high-melting-point conductive layer during the formation of the silicon nitride film. Therefore, the rise in the resistance value of the high-melting-point conductive layer resulting from the diffusion of nitrogen (N) into the high-melting-point conductive layer is inhibited by providing the barrier film between the high-melting-point conductive layer and the interlayer insulating film.

The barrier film 62 is thus formed between the high-melting-point conductive layer 60 and the interlayer insulating film to cover the circumference (e.g., side surface) of the high-melting-point conductive layer 60 as the interconnect. This makes it possible to inhibit the diffusion of an impurity originating from the interlayer insulating film into the high-melting-point conductive layer 60, and prevent the deterioration of the electrical characteristics of the high-melting-point conductive layer 60.

When a high-melting-point conductor such as Mo that easily deteriorates due to the diffusion of nitrogen is used for the interconnect, forming the barrier film made of an oxide film on the high-melting-point conductive layer (interconnect) to inhibit the diffusion of nitrogen originating from the cap layer (hard mask) or the passivation film into the Mo layer as in the present embodiment is effective. When a high-melting-point conductor that easily deteriorates due to oxygen is used for the interconnect, it is preferable to provide a barrier film made of a nitride film between the conductive layer and the interlayer insulating film made of an oxide film.

When the barrier film 62 is an oxide film formed by the oxidizing treatment of the high-melting-point conductive layer 60, oxygen is present at the interface between the high-melting-point conductive layer 60 and the barrier film (oxide film) 62. The oxygen concentration in an interconnect structure including the high-melting-point conductive layer 60 and the barrier film 62 decreases from the interface (barrier film side) between the high-melting-point conductive layer 60 and the barrier film 62 to the center of the high-melting-point conductive layer 60. Similarly, when the barrier film 62 is a nitride film formed by the nitriding treatment of the high-melting-point conductive layer 60, nitrogen is present at the interface between the high-melting-point conductive layer 60 and the barrier film (nitride film) 62. The nitrogen concentration in an interconnect structure including the high-melting-point conductive layer 60 and the barrier film 62 decreases from the interface between the high-melting-point conductive layer 60 and the barrier film 62 to the center of the high-melting-point conductive layer 60.

In this way, oxygen or nitrogen has a concentration gradient from the barrier film to the center of the high-melting-point conductive layer. As a result, the function as the barrier film can be improved on the side of the barrier film where the oxygen concentration or nitrogen concentration is high, and electrical conductivity is improved in the center of the high-melting-point conductive layer (interconnect) having low oxygen concentration or nitrogen concentration.

For example, when oxygen or nitrogen is present at the interface between the high-melting-point conductive layer 60 and the barrier film 62, the interface (surface) of the high-melting-point conductive layer (e.g., Mo layer) is terminated by oxygen or nitrogen.

If the time of the oxidizing treatment (or nitriding treatment) for forming the barrier film 62 increases, the high-melting-point conductive layer 60 is excessively oxidized, and the interconnect width (sectional area) of the conductive layer 60 is reduced. This may increase the resistance value of the conductive layer 60. It is therefore preferable that in consideration of the relation between the inhibition of diffusion of an impurity into the high-melting-point conductive layer 60 and the reduction of the interconnect width, the time of the oxidizing treatment (or nitriding treatment) for forming the barrier film and the thickness of the barrier film are properly set in accordance with the kind of interconnect material and the dimension of the interconnect.

In the example shown in FIG. 8, it is preferable that when Mo is used as the interconnect material, the oxidizing treatment is conducted in a range of 30 sec to 130 sec to inhibit the rise of the resistance value attributed to the reduction in the interconnect width and thickness of the Mo layer. However, the time of the oxidizing treatment may be adjusted in accordance with the dimensions of the interconnect formed by Mo.

The formation conditions of the barrier film are more specifically described with reference to FIG. 6A, FIG. 6B, FIG. 7A, FIG. 7B, FIG. 9A, and FIG. 9B. Here, the high-melting-point conductive layers made of Mo and W are shown by way of example to describe the barrier films provided on these conductive layers (Mo layer and W layer). In the case described here, the barrier films are formed by the oxidizing treatments of the Mo layer and the W layer.

As described above, FIG. 6A to FIG. 7B are graphs showing the oxidizing velocities of Mo and W.

Figure 9A:
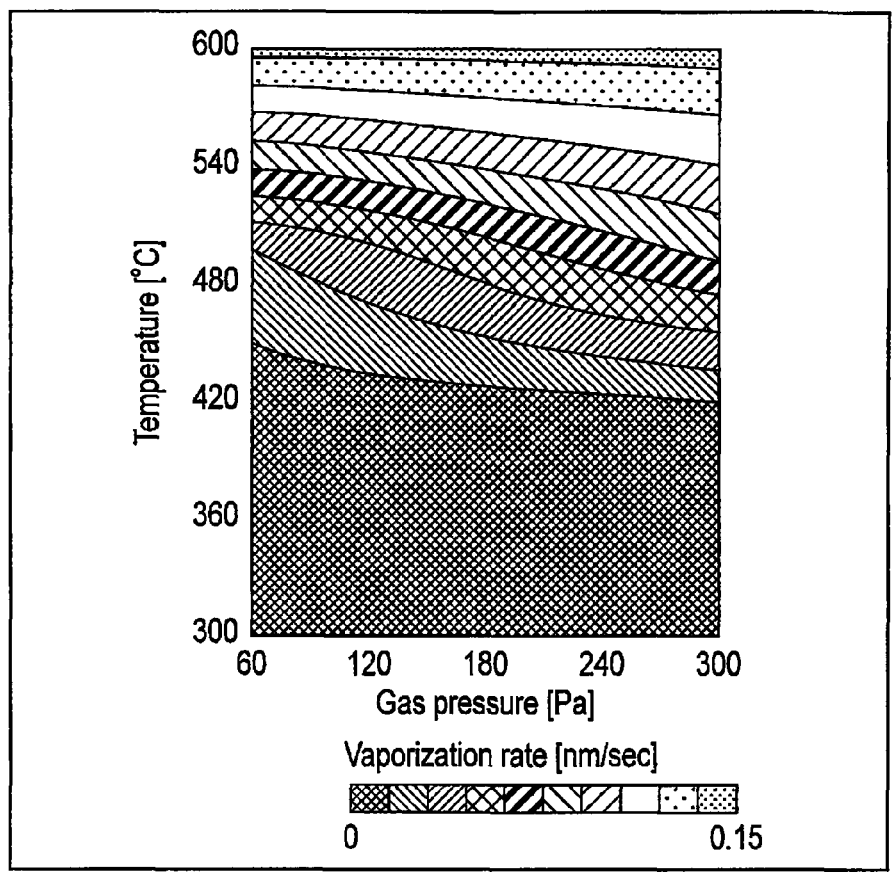
FIG. 9A is a graph illustrating a formation condition of the semiconductor device according to the embodiment.
Figure 9B:
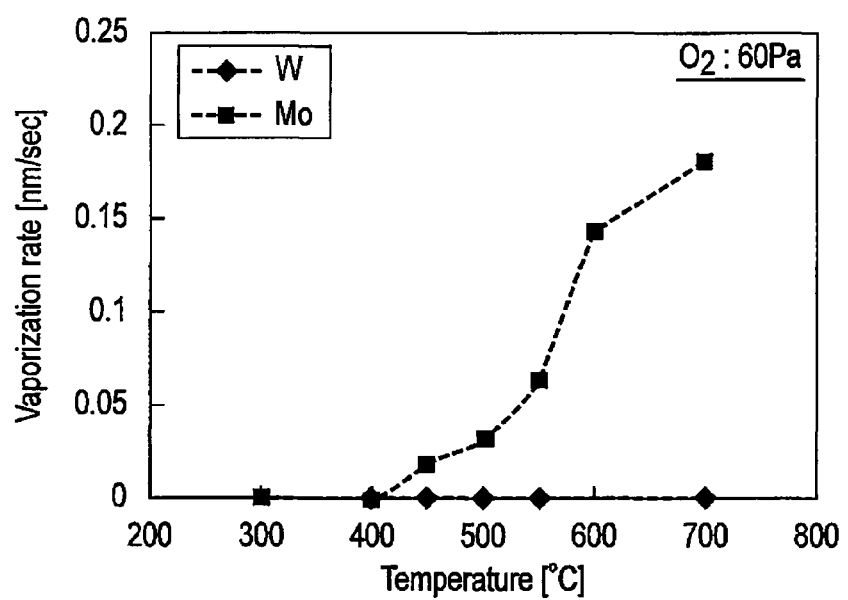
FIG. 9B is a graph illustrating a formation condition of the semiconductor device according to the embodiment.

FIG. 9A and FIG. 9B are graphs illustrating the vaporization velocity of the high-melting-point conductors. FIG. 9A shows a two-dimensional map of the vaporization velocity (vaporization rate) of Mo in oxygen atmosphere. In FIG. 9A, the horizontal axis of the graph indicates the $O_2$ gas pressure (unit: [Pa]), and the vertical axis of the graph indicates the heating temperature. FIG. 9B shows an example of the relation between the vaporization velocities of Mo and W and the heating temperature when the $O_2$ gas pressure is set to 60 Pa. In FIG. 9B, the horizontal axis of the graph indicates the heating temperature, and the vertical axis of the graph indicates the vaporization velocity.

When the barrier film is formed on the surface of the interconnect having the Mo layer or the W layer, the formation conditions of the barrier film are preferably set in consideration of the excessive oxidizing of the conductor, the vaporization of the conductor, and the vaporization (sublimation) of an oxide of the conductor in order to inhibit the rise in the resistance value of the interconnect attributed to the formation of the barrier film.

As shown in FIG. 9A and FIG. 9B, for example, when the $O_2$ gas pressure is set to 60 Pa, the vaporization velocity of Mo is substantially 0 nm/sec at an Mo layer heating temperature of 450° C. or less. As has been described with reference to FIG. 6A to FIG. 7B, the oxidizing velocity of Mo is about 0.02 nm/sec to 0.03 nm/sec in the oxidizing atmosphere in which the $O_2$ gas pressure is set to 60 Pa, when the heating temperature is set to a range of about 400° C. to 450° C. When the heating temperature for the Mo layer is set to 500° C. or more, the vaporization velocity of Mo is 0.04 nm/sec or more, and the oxidizing velocity of Mo is 0.05 nm/sec or more.

As shown in FIG. 9B, when the $O_2$ gas pressure is set to 60 Pa, W shows a vaporization velocity of substantially 0 nm/sec at a heating temperature of 300° C. to 700° C. The example shown in FIG. 9B is not a limitation. At an $O_2$ gas pressure of 60 Pa to 300 Pa and at a temperature of 300° C. to 700° C., W shows a vaporization velocity of substantially 0 nm/sec and hardly vaporizes (sublimates). Thus, the vaporization rate of W is sufficiently low as compared with the vaporization rate of Mo.

As shown in FIG. 6A to FIG. 7B, FIG. 9A and FIG. 9B, when the Mo layer is heat-treated in the oxidizing atmosphere in which the $O_2$ gas pressure is 60 Pa, Mo vaporizes at a heating temperature of 500° C. or more in the oxidizing atmosphere. Under such conditions, the vaporization velocity of Mo (Mo oxide) and the oxidizing velocity of Mo increase.

Therefore, at a heating temperature of 500° C. or more, the dimension (sectional area) of the Mo layer that contributes to the conductivity of the interconnect may decrease and the resistance value of the interconnect may increase due to the excessive oxidizing of the Mo layer and the vaporization of Mo (or Mo oxide) during the formation of the barrier film.

Therefore, when the barrier film is formed on the side surface (exposed surface) of the Mo layer by the oxidizing treatment, it is preferable to set a heating temperature and $O_2$ gas pressure at which the side surface of the Mo layer is gradually (slowly) oxidized and at which Mo (Mo oxide) hardly vaporizes, in order to prevent the vaporization of Mo. For example, when a barrier film made of an oxide film is formed on the Mo layer, the heating temperature for the Mo layer in the oxidizing atmosphere for forming the barrier film is set to a temperature less than 500° C., particularly preferably, to a temperature range of 400° C. to 450° C. It is also preferable that the oxidizing velocity of the conductor is lower in order to inhibit the excessive oxidizing of the conductor. Therefore, when the heating temperature for the Mo layer is set to 400° C. to 450° C., the $O_2$ gas pressure for forming the barrier film is preferably set to about 60 Pa.

When W is used for the interconnect, the $O_2$ gas pressure and the heating temperature for forming the barrier film are properly set in consideration of the oxidizing velocity of W to prevent the excessive oxidizing of W because W hardly vaporizes.

As described above, it is preferable that the barrier film is formed on the interconnect made of a high-melting-point metal under conditions in which the vaporization velocity of the high-melting-point conductor is less than the oxidizing velocity of the high-melting-point conductor. When such barrier film formation conditions, are set, it is possible to prevent the reduction in the width and thickness of the interconnect due to the vaporization and excessive oxidizing of the high-melting-point conductor for forming the interconnect, and to also prevent the sublimation of the barrier film.

This makes it possible to prevent the rise in the resistance value of the interconnect resulting from the formation of the barrier film.

When Mo is used for the interconnect, for example, the $O_2$ gas pressure is set to 60 Pa and the heating temperature is set to a range of 400° C. to 450° C. as an example of the formation conditions of the barrier film. As a result, the vaporization velocity of Mo is lower than the oxidizing velocity of Mo.

Figure 10:
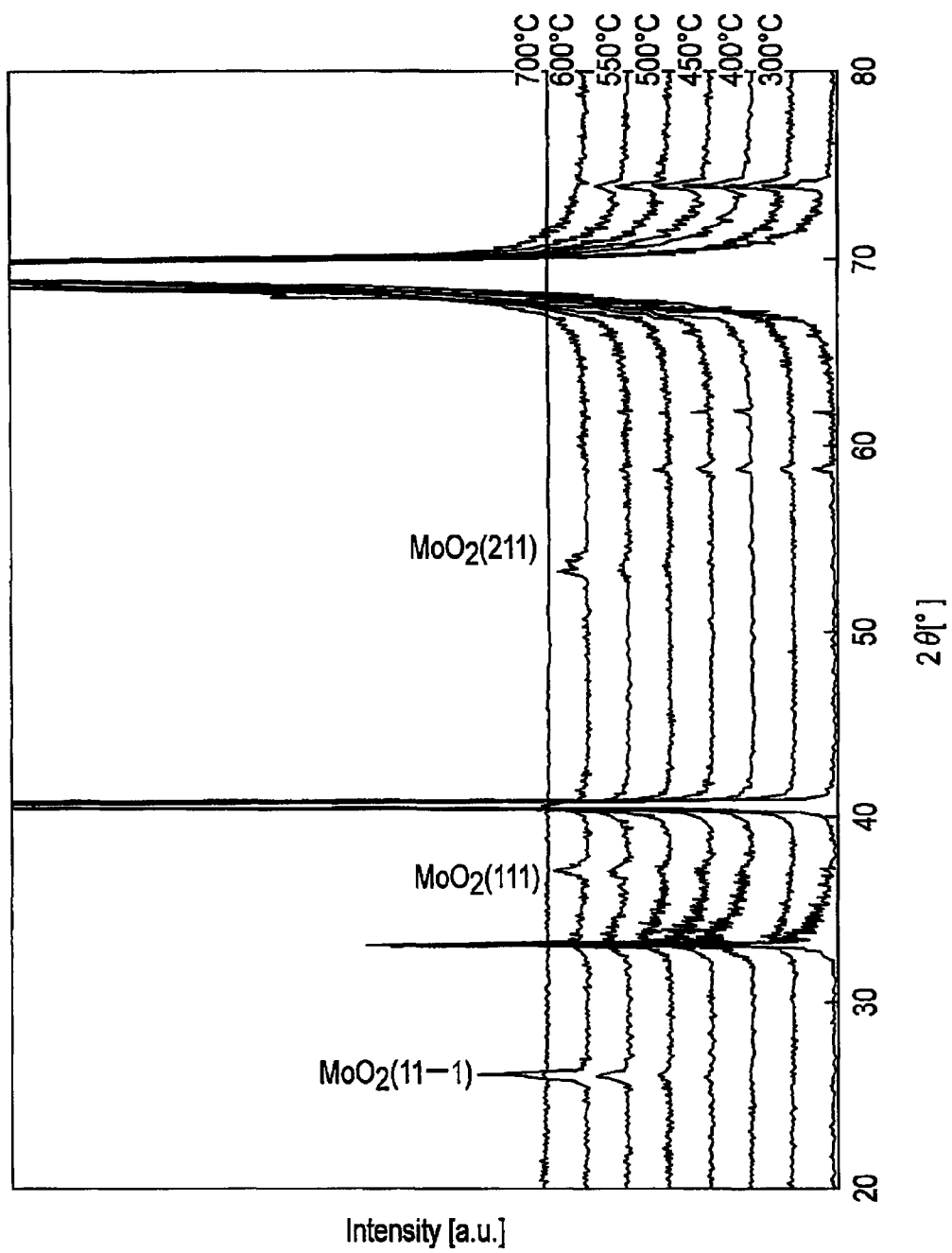
FIG. 10 is a graph illustrating a formation condition of the semiconductor device according to the embodiment.

When the barrier film is formed by the oxidizing treatment of the Mo layer as the interconnect under the above-described barrier film formation conditions, an Mo oxide is formed on the Mo layer. FIG. 10 shows an X-ray diffraction (XRD) profile of an example of the composition of the Mo oxide formed by the oxidizing treatment. The XRD profile in FIG. 10 shows measurements based on a 2θ-θ method (powder method). The horizontal axis of the graph indicates 2θ (unit: [°]), and the vertical axis of the graph indicates diffraction intensity (unit: [a.u.]).

As shown in FIG. 10, a diffraction peak of $MoO_2(11\text{-}1)$ is detected when 2θ=26°, a diffraction peak of $MoO_2(111)$ is detected when 2θ=37°, and a diffraction peak of $MoO_2(211)$ is detected when 2θ=53.4°.

These XRD analyses show the diffraction peaks of molybdenum dioxide ($MoO_2$).

Thus, the barrier film (Mo oxide) formed on the Mo layer under the above-described conditions mainly includes $MoO_2$. A native oxide film of Mo formed on the Mo layer is, for example, molybdenum trioxide ($MoO_3$).

For example, when the thickness of the interconnect is about 50 nm, the thickness of an $MoO_2$ film as the barrier film is preferably about 1 nm to 3 nm. If the thickness of the $MoO_2$ film is about 1 nm to 3 nm, the diffusion of a reacting species (N) to the interconnect (high-melting-point conductive layer) can be inhibited, and the rise in the resistance value of the interconnect resulting from the reduction in the interconnect width attributed to the formation of the barrier film can be inhibited. However, the thickness of the barrier film is properly adjusted in accordance with the dimension (thickness or width) of the interconnect.

The barrier film (Mo oxide film) on the Mo layer may be a film including both $MoO_2$ and $MoO_3$. The barrier film may also include an element for forming the interlayer insulating film in addition to the elements included in the high-melting-point conductor. For example, the barrier film (e.g., the Mo oxide film including $MoO_2$) may include Si, H, N, or C. When the high-melting-point conductive layer 60 as the interconnect is an Mo layer, the barrier film formed on this Mo layer may be an Mo nitride film (MoN film).

Although Mo and W are used as the interconnect materials in the example described here, a barrier film can be formed in other high-melting-point conductors such as Ta, Ru, or a silicide by taking the oxidizing velocity and vaporization velocity of the conductor into consideration.

When the oxide film or nitride film as the barrier film is formed by the oxidizing treatment or nitriding treatment, an oxidizing species or a nitriding species may diffuse into the high-melting-point conductive layer 60, and the volume may increase due to the formation of the oxide film or nitride film. Therefore, when the barrier film is thick, the side surface of the barrier film 62 may project as compared with the side surface of the cap layer 68 in a direction level with the surface of the substrate. In this case, the dimension of a part including the high-melting-point conductive layer 60 and the barrier film 62 in the width direction of the interconnect is larger than the width W2 of the cap layer 68, and a step is formed between the cap layer 68 and the barrier film 62. Therefore, the thickness of the barrier film is preferably about 1 to 3 nm.

<Formation of Barrier Film by Self-Passivation>

The barrier film 62 on the high-melting-point conductive layer 60 may be formed by the self-passivation of a metal. In this case, an element (e.g., metal element) other than the high-melting-point metal selected as the interconnect material is added to the high-melting-point conductor as an interconnect material. The element (metal element) added to the high-melting-point conductive layer is hereinafter referred to as an additional element (second element) or an additional metal.

It is preferable that the additional metal is selected from materials which do not increase the resistance value of the interconnect by a compound of the high-melting-point conductor and the additional metal, and the additional metal is added to the high-melting-point conductive layer 60 (the conductive layer is doped with the additional metal). It is preferable that a metal which is higher than the high-melting-point metal in the diffusion velocity in the high-melting-point conductive layer 60 is added to the high-melting-point conductive layer 60. It is also preferable that the melting point of the material (element) added to the interconnect material is lower than the melting point of the interconnect material (high-melting-point conductor).

The high-melting-point conductive layer 60 including the additional metal is heat-treated in the oxidizing atmosphere or nitriding atmosphere, so that the additional metal in the high-melting-point conductive layer 60 is separated out on the side surface (exposed surface) of the high-melting-point conductive layer, and an oxide film or nitride film of the separated-out metal is formed along the side surface of the high-melting-point conductive layer.

In the present embodiment, the barrier film formed by the self-passivation of the metal is referred to as a self-passivation film.

FIG. 11 is a graph showing the standard oxide formation energy (also referred to as oxide formation energy) of metals. In FIG. 11, the vertical axis indicates the oxide formation energy of the metals, and the horizontal axis indicates oxides to be formed.

For example, when an Mo layer or W layer is used for the high-melting-point conductive layer as the interconnect, it is preferable that in order to form the self-passivation film, a metal element (material) equal to or less than the standard oxide formation energy of the oxide of Mo or W is added to the Mo layer or W layer as the interconnect material. The formation energy of an Mo oxide (here, $MoO_3$) and a W oxide (here, $WO_2$) is about 450 kJ/mol. Therefore, when the self-passivation film of the additional metal is formed as the barrier film by the oxidizing treatment of the Mo layer or W layer, the standard oxide formation energy of the metal added to the Mo layer or W layer is preferably 450 kJ/mol or less.

It is also preferable that the oxide of the added metal is a chemically stable material as compared with the Mo oxide and the W oxide.

In view of this, when a self-passivation film made of an oxide is formed for the interconnect 60 that uses Mo or W, it is preferable that aluminum (Al) or zirconium (Zr) is added to the Mo layer or W layer. When Al is formed in the Mo or W layer, an aluminum oxide ($Al_xO_y$) film is formed on the side surface (exposed surface) of the Mo layer or W layer. When Zr is formed in the Mo or W layer, a zirconium oxide ($ZrO_y$) film is formed on the side surface of the Mo layer or W layer. Vanadium (V) or titanium (Ti) may be added to the Mo layer or W layer. Although the values (the composition ratio of elements) of x and y in the composition formula preferably satisfy the stoichiometric composition, a compositional deviation may be included depending on formation conditions.

FIG. 12 is a graph showing the standard nitride formation energy (also referred to as nitride formation energy) of metals. In FIG. 12, the vertical axis indicates the nitride formation energy of the metals, and the horizontal axis indicates metal nitrides to be formed.

When a self-passivation film is formed by a nitride of the added metal element, it is also preferable that the nitride formation energy of the metal element to be added is equal to or less than the nitride formation energy of the high-melting-point conductor as the interconnect and that a formed nitride is a material more chemically stable than the nitride of the high-melting-point conductor. The formation energy of the Mo nitride (here, $MO_2N$) is, for example, about 100 kJ/mol. For example, when a self-passivation film of the additional metal is formed by the nitriding treatment of the Mo layer, the nitride formation energy of the metal added to the Mo layer is preferably 100 kJ/mol or less.

For example, when Mo is used to form the interconnect 60, it is preferable to use Al or Zr as an additional metal. When Al is added to the Mo layer, an $Al_x N_y$ film is formed along the circumference (exposed surface) of the Mo layer. When Zr is added to the Mo layer, a $Zr_xN_y$ film is formed along the circumference (exposed surface) of the Mo layer.

Here, a method of forming the self-passivation film is described with reference to FIG. 13A, FIG. 13B, and to FIG. 13C. FIG. 13A to FIG. 13C are diagrams illustrating the method of forming the self-passivation film.

For example, as shown in FIG. 13A, a high-melting-point conductive layer 60X including a predetermined concentration of an additional metal 81 is deposited on a substrate 89. When the high-melting-point conductive layer 60X is deposited, the additional metal 81 is substantially uniformly spread in the high-melting-point conductive layer 60X.

For example, a contact layer (not shown) of, for example, molybdenum nitride or titanium nitride may be formed on the substrate (e.g., SiO$_2$ layer), and the high-melting-point conductive layer 60X may be deposited on the contact layer.

The high-melting-point conductive layer (high-melting-point metal layer) 60X including the additional metal 81 may be formed by the sputtering method that uses an alloy target which includes the additional metal 81 and a high-melting-point metal set to a predetermined composition ratio, or may be formed by the sputtering method that uses a metal target of the additional metal 81 and a target of the high-melting-point conductor. A predetermined metal element may be added to the high-melting-point conductive layer by ion implantation after the high-melting-point conductive layer is deposited on the substrate 89. The metal element is not exclusively added to the high-melting-point conductive layer in the manner illustrated here.

The mask layer (cap layer) 68 is then deposited on the high-melting-point conductive layer 60X.

As shown in FIG. 13B, the patterned mask layer 68 is used as a mask to fabricate the high-melting-point conductive layer 60 including the additional metal 81 so that the high-melting-point conductive layer 60 will have a predetermined interconnect pattern. The fabricated high-melting-point conductive layer 60 is annealed, for example, in an oxygen atmosphere to form a barrier film. At the same time, oxygen is injected from the exposed surface (here, side surface) of the high-melting-point conductive layer 60, and the additional metal 81 diffuses to the exposed surface of the high-melting-point conductive layer 60 and is separated out on the exposed side of the high-melting-point conductive layer 60. As the additional metal 81 is thus separated out on the exposed side of the high-melting-point conductive layer 60, the diffusion velocity of the additional metal 81 is preferably higher than the diffusion velocity of the high-melting-point conductor.

In this way, as shown in FIG. 13C, a self-passivation film 62A as a barrier film is formed on the exposed surface of the high-melting-point conductive layer 60. As described above, when the oxide formation energy of the additional metal 81 is lower than the oxide formation energy of the high-melting-point conductor, the additional metal 81 mainly reacts with oxygen, and a metal oxide of the additional metal 81 is formed on the exposed surface (side surface) of the high-melting-point conductive layer 60. However, the self-passivation film 62A may include the metal oxide of the additional metal and an oxide of the high-melting-point conductor (high-melting-point metal).

The additional metal 81 is separated out on the exposed side of the high-melting-point conductive layer 60, and the self-passivation film 62A is formed on the exposed surface of the high-melting-point conductive layer 60. As a result, the element concentration of the additional metal 81 in the center (inner part) of the high-melting-point conductive layer 60 is lower than the element concentration of the additional metal 81 in the side surface (circumference) of the high-melting-point conductive layer 60. However, the element concentration of the additional metal 81 in the center of the high-melting-point conductive layer 60 may be about the same as the element concentration of the additional metal 81 in the side surface of the high-melting-point conductive layer 60.

After the self-passivation film 62A is formed, an interlayer insulating film (not shown) is deposited on the substrate 89 to cover the high-melting-point conductive layer 60 and the self-passivation film 62A.

As shown in FIG. 13A to FIG. 13C, the self-passivation film 62A as the barrier film is formed on the side surface of the high-melting-point conductive layer 60, 60X as the interconnect by the self-passivation of the metal 81 added to the high-melting-point conductive layer 60, 60X.

When the barrier film 62A is formed by the self-passivation of the additional metal, oxygen or nitrogen is also present at the interface between the high-melting-point conductive layer 60 and the self-passivation film 62A depending on whether the self-passivation film is an oxide film or nitride film. The oxygen concentration or nitrogen concentration in an interconnect structure including the high-melting-point conductive layer 60 and the self-passivation film 62A decreases from the interface between the high-melting-point conductive layer 60 and the self-passivation film 62A to the center of the high-melting-point conductive layer 60.

As described above, the self-passivation film 62A is formed on the side surface of the interconnect, such that the diffusion of an oxidizing species or a nitriding species generated during the formation of the interlayer insulating film into the high-melting-point conductive layer 60 can be reduced, and the deterioration of the electrical characteristics of the interconnect (e.g., a rise in the resistance value) can be inhibited.

However, there are cases where a barrier film having a thickness that can prevent the diffusion of the oxidizing species or the nitriding species cannot be formed due to miniaturization or a barrier film (or self-passivation film) cannot be formed from the perspective of the consistency of a process. If the interlayer insulating film is formed after the barrier film having a predetermined thickness is formed, the thickness of the barrier film may increase, and the width of the interconnect may decrease. Alternatively, the characteristics of the barrier film may deteriorate due to the diffusion of the oxygen or nitrogen into the barrier film. Therefore, when the barrier film is formed, it is also preferable to take the formation conditions of the interlayer insulating film into consideration as described above to prevent the deterioration of the barrier film and the interconnect.

The barrier film 62 and the self-passivation film 69 formed by the chemical reaction treatment of the exposed surface of the high-melting-point conductive layer 60 may be incomplete oxide films or nitride films on the high-melting-point conductive layer 60. Even when the incomplete oxide film or nitride film is provided on the high-melting-point conductive layer 60 as the barrier film 62, oxygen or nitrogen has only to be present at the interface between the barrier film 62 and the high-melting-point conductive layer 60. When oxygen or nitrogen is present at the interface between the barrier film 62 and the high-melting-point conductive layer 60, the incomplete oxide film or nitride film has the interface (surface) of the high-melting-point conductive layer (e.g., Mo layer) terminated by oxygen or nitrogen at the interface between the high-melting-point conductive layer 60 and the barrier film. For example, the barrier film 62 formed by the oxide film may be a film that includes oxygen deficiency with respect to the stoichiometric composition, or the barrier film 62 formed by the nitride film may be a film that includes nitrogen deficiency with respect to the stoichiometric composition.

(e) Summary

The semiconductor device according to the present embodiment includes the interconnect 60 formed by the high-melting-point conductor.

The high-melting-point conductor for forming the interconnect 60 has a melting temperature of 1000° C. or more. This high-melting-point conductor can inhibit the deterioration of the interconnect caused by high temperature under a temperature condition (1100° C. or less) of the semiconductor device manufacturing process, as compared with a material (Cu or Al) having a relatively low melting temperature.

For example, Mo, W, Ru, Ta, Ni, or Co is used for the metal (high-melting-point metal) as the high-melting-point conductor. A silicide such as MoSi, WSi, NiSi, or CoSi may be used for the metal compound (high-melting-point compound) as the high-melting-point conductor. In the semiconductor device according to the present embodiment, one conductor selected from the group including these high-melting-point metals and high-melting-point metal compounds is used to form the interconnect 60.

The interconnect 60 is formed by using these high-melting-point conductors, such that the crystal grains of the high-melting-point conductor included in the interconnect 60 can be larger, and the resistivity (resistance value) of the interconnect can be reduced.

In order to increase the grain diameter of the high-melting-point conductor that forms the interconnect 60, the high-melting-point conductive layer 60 is subjected to, for example, the heat treatment of the substrate during the deposition of the high-melting-point conductive layer 60 or post annealing after the deposition of the high-melting-point conductive layer. As a result of the heat treatment of the high-melting-point conductive layer 60, the crystallinity of the high-melting-point conductive layer 60 is improved, and the crystal grains included in the high-melting-point conductive layer 60 as the interconnect become larger.

It is preferable to use a high-melting-point conductor having a recrystallization temperature of 1000° C. or less so that the crystal grains in the high-melting-point conductive layer are increased in diameter by a heat treatment. When the recrystallization temperature of the high-melting-point conductor is taken into consideration, Mo, Ru, or Ta, for example, is used for the high-melting-point conductor for forming the interconnect. This makes it possible to improve the crystallinity of the high-melting-point conductive layer as the interconnect (increase the diameter of the crystal grains) under the temperature condition included in the semiconductor device manufacturing process.

It is preferable to reduce the fabricated high-melting-point conductive layer in a nitrogen atmosphere. As a result, the exposed surface of the high-melting-point conductive layer as the interconnect is reduced, the decrease in the dimension of the interconnect can be inhibited, and the rise in the resistance value can be inhibited.

For example, during the formation of the interlayer insulating film covering the interconnect 60, the formation conditions of the interlayer insulating film are set so that the electrical characteristics of the interconnect formed by the high-melting-point conductor do not deteriorate due to the conditions for forming the interlayer insulating film.

For example, during the formation of the interlayer insulating film, it is preferable that the interlayer insulating film made of an oxide film is formed under a temperature condition of 400° C. or less in at least the initial stage of the formation of the interlayer insulating film. It is also preferable that, for example, the $O_2$ gas pressure for forming the interlayer insulating film made of an oxide is about 60 Pa or less.

The formation conditions of the interlayer insulating film are thus taken into consideration, such that excessive oxidizing or nitriding of the high-melting-point conductor (e.g., Mo) is inhibited, and the reduction in the width and thickness of the interconnect due to the oxidizing or nitriding of the conductive layer is lessened. As a result, the rise in the resistance value of the interconnect formed by the high-melting-point conductor can be prevented.

For example, the barrier film 62 is provided on the side surface of the interconnect 60 formed by the high-melting-point conductor. The barrier film 62 is provided between the high-melting-point conductive layer 60 and the interlayer insulating film, such that the diffusion of an impurity originating from the interlayer insulating film into the high-melting-point conductive layer 60 can be inhibited, and the rise in the resistance value of the interconnect can be inhibited.

The barrier film 62 is formed by, for example, an oxide film, a nitride film, or an oxynitride film. For example, when the barrier film 62 is formed on the side surface of the high-melting-point conductive layer 60' by the oxidizing treatment or nitriding treatment of the high-melting-point conductive layer 60 as the interconnect, the interconnect width W1 of the high-melting-point conductive layer 60 is smaller than the width W2 of the cap layer (hard mask) for forming the high-melting-point conductive layer 60, as shown in FIG. 1 or FIG. 13C. In this case, the side surface of the barrier film 62 does not project as compared with the side surface of the cap layer 68 in a direction level with the surface of the substrate. Therefore, even if the barrier film 62 is formed on the side surface of the high-melting-point conductive layer 60, the interconnect width of the interconnect structure including the high-melting-point conductive layer 60 and the barrier film 62 does no increase. The distance between the adjacent interconnects is hardly reduced by the formation of the barrier film 62. Therefore, the interconnect structure according to the present embodiment allows a micro interconnect pattern to be relatively easily formed.

When the barrier film 62 is formed by the oxidizing treatment or nitriding treatment of the high-melting-point conductive layer 60, a step is not easily formed between the side surface of the cap layer 68 and the side surface of the barrier film 62. Therefore, the contact and covering performance of the interlayer insulating film (SiN film) 69 covering the interconnect structure including the barrier film 62 is improved.

In order to inhibit the reduction in the width and thickness of the interconnect, it is preferable that the barrier film 62 is formed so that the high-melting-point conductor is gradually oxidized or nitrided and hardly vaporizes under conditions in which an oxide or nitride of the high-melting-point conductor is formed. For example, when a barrier film including an Mo oxide is formed on the side surface of the interconnect formed by using Mo, the barrier film (in this case, a film including $MoO_2$) is preferably formed under conditions in which the $O_2$ gas pressure is set to 60 Pa and the heating temperature is set to a range of 400° C. to 450° C. For example, the thickness of the $MoO_2$ film as the barrier film is preferably about 1 nm to 3 nm.

The barrier film 62 may be formed by the self-passivation of the additional metal added to the high-melting-point metal 60. When the self-passivation film as the barrier film 62 is an oxide film, a material whereby the standard oxide formation energy of the additional metal is equal to or less than the standard oxide formation energy of the high-melting-point metal is used as the metal to be added to the high-melting-point metal. When the self-passivation film is a nitride film, a material whereby the standard nitride formation energy of the additional metal is equal to or less than the standard nitride formation energy of the high-melting-point metal is used as the additional metal.

It is preferable that a material that does not form a highly resistive compound between the additional metal and the high-melting-point conductor is used for the additional metal. It is preferable that a material higher in diffusion velocity than the high-melting-point metal is used as the additional metal. It is also preferable that a material which forms a chemically stable oxide or nitride is used as the additional metal. For example, when Mo or W is used as the high-melting-point metal, Al or Zr, for example, is added to the Mo layer or W layer as the additional metal.

When the self-passivation film as the barrier film is formed, the concentration profile of the additional metal in the interconnect shows that the concentration on the side surface (barrier film side) of the interconnect is higher than the concentration in the center of the interconnect.

Such a barrier film formed by the oxidizing/nitriding treatment of the high-melting-point conductor or by the self-passivation of the additional metal is provided on the side surface of the high-melting-point conductive layer as the interconnect. This makes it possible to inhibit the rise in the resistance of the interconnect resulting from the dimensional reduction of the high-melting-point conductive layer and the impurity diffusion.

As described above, according to the semiconductor device of the present embodiment, the resistance of the interconnect included in the semiconductor device can be reduced.

(3) Modifications

Modifications of the semiconductor device according to the present embodiment are described below with reference to FIG. 14 to FIG. 16.

As shown in FIG. 14, an interconnect 60A may have a stack structure of two conductors. For example, in the interconnect 60A having a polymetal structure, a high-melting-point conductive layer (e.g., Mo layer) 61 is stacked on a polysilicon layer 63. The polysilicon layer 63 may be provided on a barrier metal film or may be directly provided on an interlayer insulating film 75.

When a barrier film covering the interconnect 60A is formed by an oxidizing treatment, an oxide film 62 of a high-melting-point conductor is provided on the side surface of the high-melting-point conductive layer 61, and a silicon oxide film 64 is provided on the side surface of the polysilicon layer 63. The barrier films 62 and 64 may be formed by a nitriding treatment. In this case, a nitride film 62 of a high-melting-point conductor is formed on the side surface of the high-melting-point conductive layer 61, and a silicon nitride film 64 is provided on the side surface of the polysilicon layer 63.

When the high-melting-point conductor is made of a silicide, the interconnect 60A has a stack structure (polycide structure) of polysilicon and silicide. A silicide layer may be formed at the interface between the high-melting-point conductive layer 61 and the polysilicon layer 63.

As shown in FIG. 15, no cap layer may be provided on the upper surface of the high-melting-point conductive layer 60 as the interconnect. In this case, the barrier film (or self-passivation film) 62 is provided on the upper surface of the high-melting-point conductive layer 60. The barrier film 62 covering the upper surface and side surface of the high-melting-point conductive layer 60 is formed after the cap layer is removed.

As shown in FIG. 16, the interlayer insulating film does not have to be embedded in the region between the adjacent interconnects (high-melting-point conductive layers). In this case, an air gap AG is provided between the adjacent interconnects 60. The air gap AG is an air or vacuum space.

The air gap AG can be formed by reducing the space between the interconnects 60 or by intentionally using an interlayer insulating film 75B having low embedding performance.

Even when the interlayer insulating film is not embedded in the space between the interconnects 60, the side surface of the high-melting-point conductive layer 60 as the interconnect is subjected to an oxidizing atmosphere or nitriding atmosphere in a period in which the interlayer insulating film 75B covering the upper surface of the interconnect 60 is formed. Therefore, even when the air gap AG is adjacent to the interconnect 60, it is preferable that the formation temperature of the interlayer insulating film in an oxygen atmosphere is set to 400° C. or less or the barrier film (or self-passivation film) 62 is provided on the side surface of the high-melting-point conductive layer 60.

In the modifications of the semiconductor device according to the present embodiment shown in FIG. 14 to FIG. 16, the resistance of the interconnect can be reduced by increasing the diameter of the crystal grains included in the high-melting-point conductive layer as the interconnect and inhibiting the diffusion of the impurity to the interconnect, as in the example described above.

(4) Applications

Applications of the semiconductor device according to the present embodiment are described below with reference to FIG. 17 to FIG. 20.

EXAMPLE 1

Field Effect Transistor

The interconnect formed by the high-melting-point conductor described in the present embodiment can be used in, for example, a field effect transistor (FET).

FIG. 17 shows an example of the sectional structure of the field effect transistor Tr. FIG. 17 shows the sectional structure of the field effect transistor in a channel length direction.

For example, the above-described high-melting-point conductor may be used only for the interconnect 60 used in a multilayer interconnect structure but also for the gate electrode 21 of the field effect transistor Tr.

As shown in FIG. 17, the field effect transistor Tr is provided in the element formation region (active region) in the semiconductor substrate 10. The element formation region is divided by the element isolation insulating film 19 in the element isolation region. A P-type or N-type well region (not shown) is provided in the element formation region.

Two diffusion layers 23A are provided in the well region. The diffusion layers 23A are used as the source/drain of the transistor Tr. For example, source/drain electrodes 23B are provided on the surface of the diffusion layer 23A.

The gate insulating film 22 is provided on the surface of the well region (channel region of the transistor) between the two diffusion layers 23A. The gate insulating film 22 is formed by one of a silicon oxide film, a silicon oxynitride film, a high-dielectric-constant film (high-k film), and a stack of these films.

The gate electrode 21 of the transistor Tr is provided on the gate insulating film 22. A sidewall insulating film 18 is provided on the side surface of the gate electrode 21.

Contacts CP are provided on the gate electrode 21 and on source/drain electrodes 25, respectively. The electrodes 21 and 25 are connected to the interconnect 60 via the contacts CP.

The contacts CP and the interconnect 60 are provided in the interlayer insulating films 70 and 71.

The interconnect 60 is formed the above-described high-melting-point conductor (e.g., Mo).

The gate electrode 21 of the transistor Tr may have a gate structure 60B including the high-melting-point conductive layer 61 similar to the interconnect 60. When the gate electrode 21 of the transistor Tr has a single layer structure of a high-melting-point metal, a field effect transistor having a metal gate structure is formed. The gate electrode 21 of the transistor Tr may be formed by a silicide single layer structure as the high-melting-point conductor. The high-melting-point conductor as the gate electrode 21 is properly selected from the above-mentioned metals and metal compounds in accordance with the characteristics of the transistor Tr and the material of the gate insulating film 22 in consideration of the work function of the high-melting-point conductor.

As shown in FIG. 17, the gate electrode 21 of the transistor Tr may otherwise have a stack structure (polymetal structure or polycide structure) of a high-melting-point conductive layer and polysilicon. However, a compound layer (silicide layer) 63A of the high-melting-point metal layer and the polysilicon layer may be formed between the high-melting-point metal layer and the polysilicon layer.

High-melting-point conductors (metal layers or silicide layers) may be used as the source/drain electrodes 23B.

The barrier film 62 may be provided between the high-melting-point conductive layer 61 included in the gate electrode 21 and the sidewall insulating film 18. A metal element other than the high-melting-point conductor may be added to the high-melting-point conductive layer 61, and a self-passivation film made of a compound film (e.g., an oxide film or a nitride film) of the added metal elements may be formed on the side surface of the gate electrode 21 as the barrier film 62. When the barrier film 62 is provided on the side surface of the high-melting-point conductive layer 61, the sidewall insulating film 18 does not have to be provided. When the gate electrode 21 has the polymetal structure or the polycide structure, the barrier film 62 provided on the side surface of the polysilicon layer 63 is formed by a silicon oxide film or a silicon nitride film.

Thus, the high-melting-point conductor as the interconnect described with reference to FIG. 1 to FIG. 16 can be applied to the field effect transistor Tr.

EXAMPLE 2

Flash Memory

Application 2 of the semiconductor device according to the present embodiment is described with reference to FIG. 18.

The interconnect formed by the high-melting-point conductor described in the present embodiment can be used in, for example, a flash memory.

Figure 18:
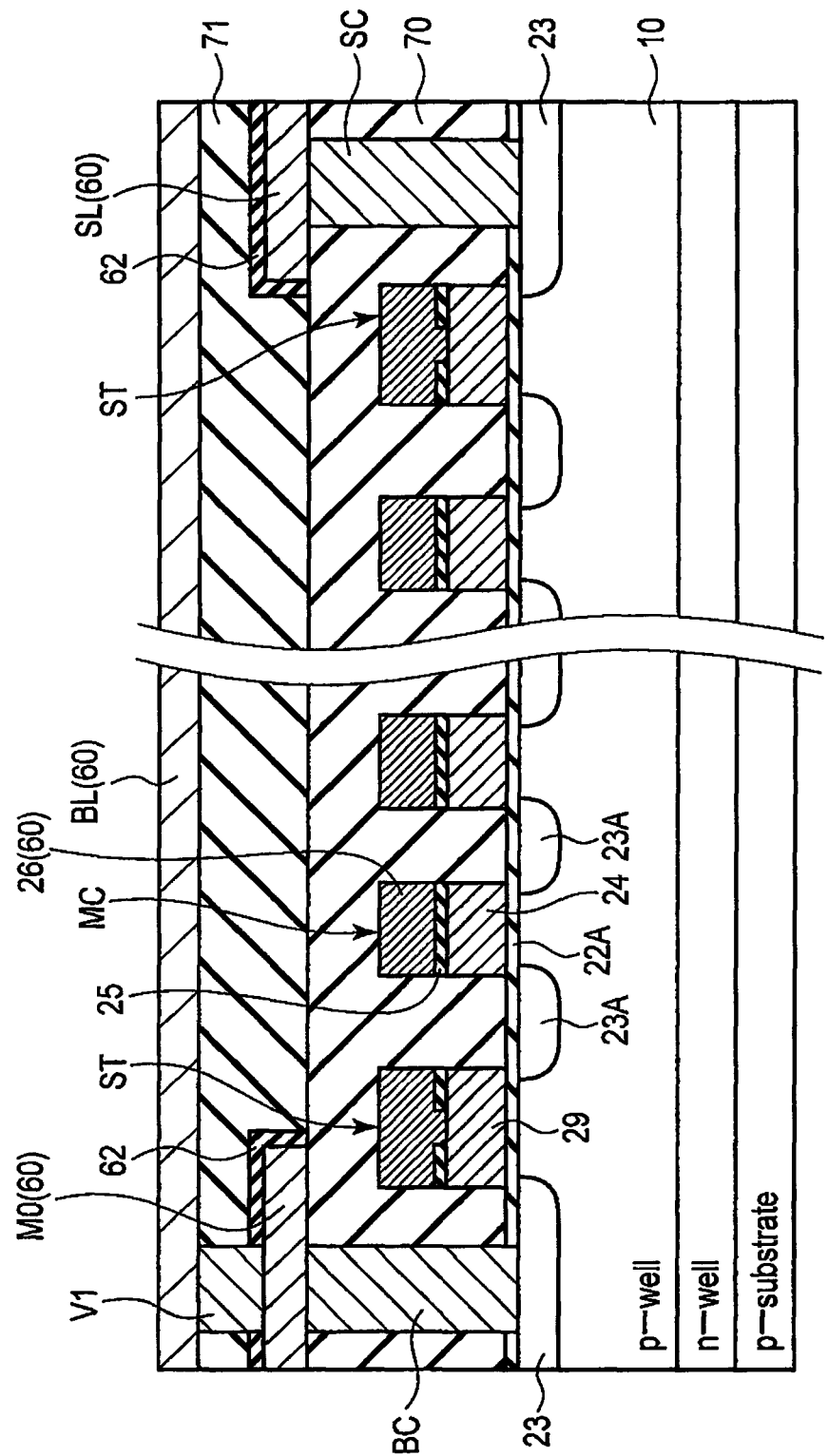
FIG. 18 is a diagram showing an application of the semiconductor device according to the embodiment.

FIG. 18 shows the sectional structure of one memory cell unit included in a NAND-type flash memory. FIG. 18 shows the sectional structure of the memory cell unit along a column direction (the extending direction of a bit line).

One memory cell unit includes a NAND string, and two select transistors ST respectively connected to one end and other end of the NAND string. The NAND string is formed by connecting the current paths (channel regions) of memory cells MC (e.g., n memory cells MC) in series.

As shown in FIG. 18, the memory cell unit is disposed in the element formation region of the semiconductor substrate 10. The element formation regions adjacent to each other in a row direction (the extending direction of a word line) are electrically isolated from each other by an element isolation insulating film (not shown).

The memory cell MC is, for example, a field effect transistor having a gate structure in which control gate electrodes 25 are stacked on a charge storage layer 24. The gate structure of the memory cell MC may be a stack gate structure in which a floating gate electrode is used for the charge storage layer 24, or may be a MONOS structure in which an insulating film (e.g., silicon nitride film) including a trap level is used for the charge storage layer 24. FIG. 18 shows an example in which a floating gate electrode is used for the charge storage layer 24.

The floating gate electrode (polysilicon layer) as the charge storage layer 24 is provided on a gate insulating film (tunnel insulating film) 22A formed on the surface of the semiconductor substrate 10.

A control gate electrode 26 is stacked on the floating gate electrode 24 via an intergate insulating film 25 on the floating gate electrode 24.

The control gate electrode 26 extends in the row direction, and is shared by the memory cells MC adjacent in the row direction. The control gate electrode 26 is used as a word line WL.

The control gate electrode 26 includes the high-melting-point conductive layer (e.g., Mo layer) 60. The control gate electrode 26 may have a single layer structure of the high-melting-point metal layer (e.g., Mo layer) 60, may have a polymetal structure including the high-melting-point conductive layer 60, or may have a stack structure of the high-melting-point conductive layer 60 and the silicide layer. Alternatively, the control gate electrode 26 may have a single layer structure of silicide as a high-melting-point conductor, or may have a polycide structure of silicide as high-melting-point conductors and polysilicon.

The memory cells MC adjacent in the column direction share the source/drain. Thus, the current paths of the memory cells MC are connected in series. For example, the diffusion layers 23A are provided in the semiconductor substrate 10 as the source/drain of the memory cell MC. However, no diffusion layers 23A may be formed.

The select transistors ST are respectively provided at one end (drain side) of the NAND string and the other (source side). The current paths of the select transistors ST are connected at one end and other end to the adjacent memory cells MC via the diffusion layers 23A, respectively.

The select transistors ST are formed in a process substantially simultaneously with the memory cells MC. A lower electrode layer of the gate electrode 29 of the select transistor ST is formed substantially simultaneously with the floating gate electrode 24. An upper electrode layer of the gate electrode 29 of the select transistor ST is formed simultaneously with the control gate electrode. In the select transistor ST, the upper electrode layer is electrically connected to the lower electrode layer via an opening formed in the insulating film (intergate insulating film) between the upper electrode layer and the lower electrode layer.

The upper electrode layer of the select transistor includes a high-melting-point conductor in the same manner as the control gate electrode 26. The upper electrode layer of the select transistor ST is shared by the select transistors adjacent in the row direction. The gate electrode 29 of the select transistor ST is used as a select gate line.

The other end (drain) 23 of the current path of the select transistor ST on the drain side of the memory cell unit is connected to a bit line BL via a bit line contact BC, an intermediate interconnect MO, and a via plug V1. The other end (source) 23 of the current path of the select transistor ST on the source side of the memory cell unit is connected to a source line SL via a source line contact SC.

The contacts BC, SC, and V1 and the interconnects M0, BL, and SL are formed in the interlayer insulating films 70 and 71.

For example, the bit line BL, the source line SL, and the intermediate interconnect M0 include the above-described high-melting-point conductor (e.g., Mo). The via plug V1 may be made of the high-melting-point conductor.

In this way, the high-melting-point conductor as the interconnect described with reference to FIG. 1 to FIG. 16 can be applied to the flash memory.

EXAMPLE 3

Resistance Change Type Memory

Application 3 of the semiconductor device according to the present embodiment is described with reference to FIG. 19 and FIG. 20.

The interconnect formed by the high-melting-point conductor described in the present embodiment can be used in, for example, a resistance change type memory.

Figure 19:
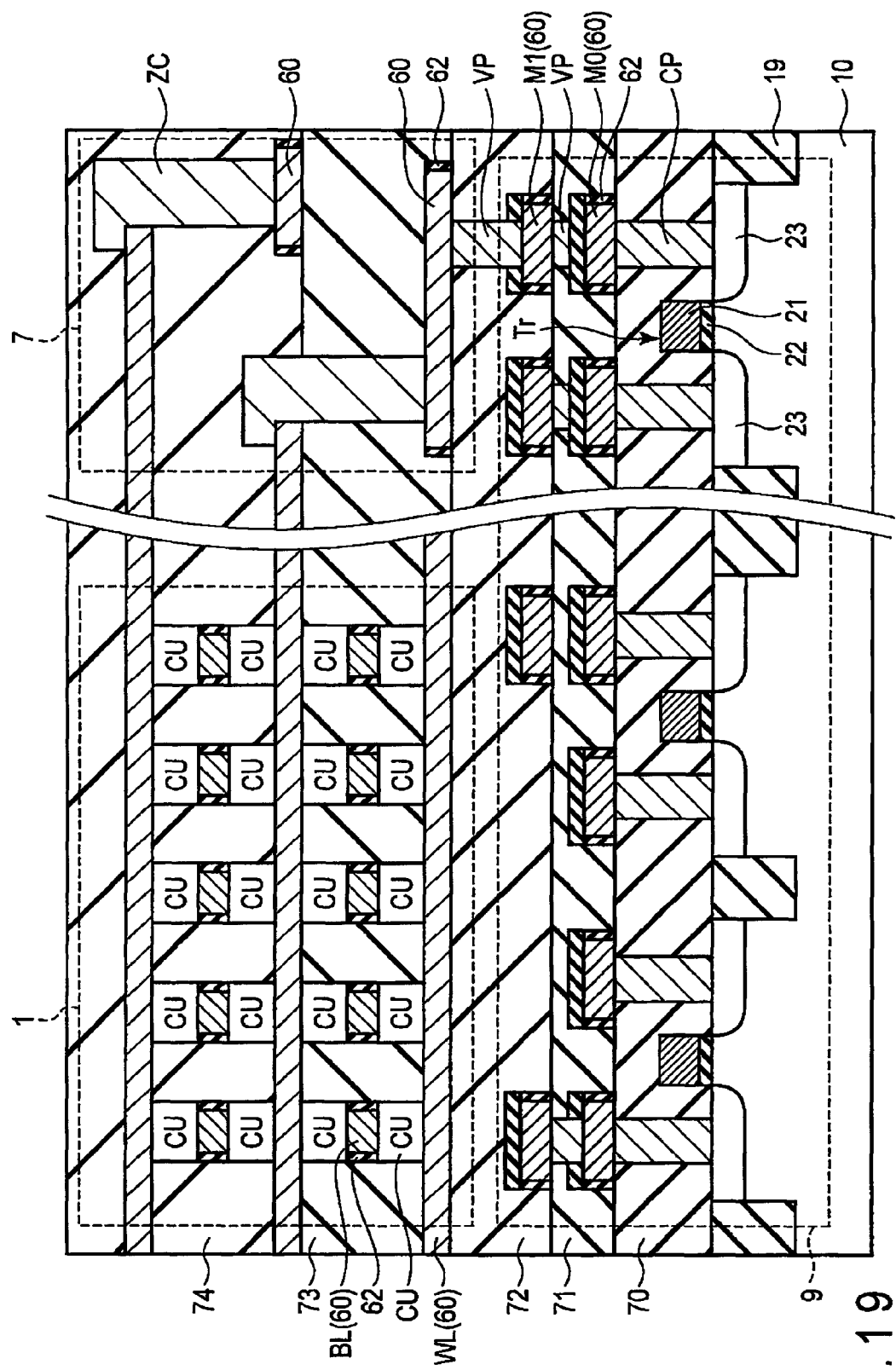
FIG. 19 is a diagram showing an application of the semiconductor device according to the embodiment.

FIG. 19 shows the sectional structure of the resistance change type memory.

As shown in FIG. 19, the resistance change type memory has a cross point type memory cell array 1. The cross point type memory cell array 1 is provided on the interlayer insulating films 70, 71, and 72 stacked on the semiconductor substrate 10. In this case, the interlayer insulating films on the semiconductor substrate 10 are used as substrates for forming the cross point type memory cell array 1.

The cross point type memory cell array 1 includes cell units CU. The cell units CU are provided between the word line (first control line) WL extending in the row direction and the bit line (second control line) BL extending in the column direction.

FIG. 20 is a bird's eye view schematically showing the structure of the cell unit CU.

In the resistance change type memory, a memory element 30 is, for example, a variable resistive element or a phase change element.

As shown in FIG. 20, the variable resistive element as the memory element 30 includes a film 31 made of a metal oxide. When a predetermined voltage (or current) is applied to the thin film 31 made of a metal oxide, the resistance value of the film 31 reversibly changes with the applied voltage. The resistance value of the variable resistive element 30 is kept changed in a substantially nonvolatile manner until a predetermined voltage is applied thereto. The characteristics of such a metal oxide film 31 are used to form the memory element 30 that uses the variable resistive element. The film 31 which is included in the variable resistive element 30 and which changes its resistance state is referred to as a resistance change film 31. The resistance change film 31 is formed by an oxide of a transition metal such as titanium oxide ($TiO_x$) or hafnium oxide ($HfO_x$).

An example of a mechanism for the change of resistance state in the resistance change film 31 made of the metal oxide film is a resistance change resulting from the production or disappearance of a micro current path (referred to as a filament) in the resistance change film 31. The filament is formed by local dielectric breakdown or by the segregation of metal atoms. The resistance state of the resistance change film 31 may change by the movement of metal ions or oxygen ions in the resistance change film 31.

The phase change element as the memory element 30 includes, for example, a film (hereinafter referred to as a phase change film) 31 which changes its crystalline state (phase) with applied heat. The phase change film 31 is made of a compound such as GeSbTe (GST) or InSbTe (IST).

For example, the crystal orientation of the phase change film 31 changes due to heat generated by the voltage or current applied to the phase change element 30 as the memory element 30. As a result, the resistance value of the phase change film changes.

The resistance change film (phase change film) 31 intervenes between two electrode layers 32A and 32B. For example, it is preferable that the material of the electrode layers 32A and 32B is properly selected in accordance with the material of the resistance change film 31. When the memory element 30 is a phase change element, a heater layer may be provided between the phase change film 31 and one electrode layer.

A magnetic tunnel junction (MTJ) element may be used for the memory element 30.

As shown in FIG. 20, the cell unit CU includes a selecting element to inhibit mutual interference between the memory element which is targeted for operation and the memory element which is not targeted for operation. For example, a diode is provided in the cell unit CU as the selecting element. In the cross point type memory cell array, the cell unit CU has a stack structure of the memory element 30 and a diode 35. In the example shown in FIG. 20, the memory element 30 is stacked on the diode 35. However, the diode 35 may be stacked on the memory element 30. In the cell unit CU, the diode 35 is connected in series to the memory element 30. Instead of the diode 35, a capacitor may be provided in the cell unit CU.

The bit line BL and the word line WL are formed by using the above-described high-melting-point conductor (e.g., Mo). For example, the barrier film (or self-passivation film) 62 is provided on the side surface of the high-melting-point conductive layer 60 as the bit line BL and the word line WL.

In the present embodiment, a circuit (hereinafter referred to as a peripheral circuit) for controlling the operation of the memory cell array is provided on the semiconductor substrate 10 under the cross point type memory cell array 1. The region where the peripheral circuit is provided is referred to as a peripheral region 9. For example, the peripheral region includes, as its components, the field effect transistor Tr, the resistive element, and the capacitor. As shown in FIG. 17, the field effect transistor Tr constituting the peripheral circuit of the resistance change type memory may include a gate electrode or source/drain electrodes made of a high-melting-point conductor.

In a direction level with the surface of the semiconductor substrate 10, a hookup region (also referred to as a leader region) 7 is provided on the interlayer insulating film 72 to be adjacent to the cross point type memory cell array 1.

The bit line BL and the word line WL are led into the hookup region 7 from the cross point type memory cell array 1. In the hookup region 7, the interconnect widths of the bit line BL and the word line WL, the interconnect pitch of adjacent interconnects, and the interconnect layout are converted. In the hookup region 7, the bit line BL and the word line WL are connected to the lower or upper interconnect (high-melting-point conductive layer) 60 via a contact plug ZC. In interlayer insulating films 73 and 74 covering the memory cell array 1, the contact plug ZC is provided, for example, across interconnect levels.

The element Tr formed on the semiconductor substrate 10 is connected to the memory cell array 1 via the interconnect 60 and the contact plug ZC in the hookup region 7.

Although the hookup region adjacent to the cross point type memory cell array 1 in the row direction is only shown in FIG. 19, the hookup region adjacent to the cross point type memory cell array 1 in the column direction may be provided on the interlayer insulating film (substrate) 72.

In accordance with the interconnect layout of the resistance change type memory, an interconnect at the same interconnect level as the bit line may be led into the hookup region 7 adjacent to the memory cell array 1 in the row direction.

As shown in FIG. 19, the peripheral circuit for controlling the operation of the cross point type memory cell array 1 is formed on the semiconductor substrate 10 under the cross point type memory cell array 1 via the interlayer insulating films 70, 71, and 72. The same material (e.g., Mo) as the high-melting-point conductor for forming the interconnect 60 may be used for the intermediate interconnects M0 and M1 and a via plug VP which connect the peripheral circuit and the interconnect (high-melting-point conductive layer) 60 in the hookup region 7.

The cross point type memory cell array 1 is stacked on the peripheral region 9, such that the chip size of the resistance change type memory is reduced.

For example, when the diode 35 in the cell unit CU is made of silicon, a heat treatment at 700° C. or more may be included in the manufacturing process of the resistance change type memory for the crystallization of silicon. Therefore, as in the present embodiment, the use of the high-melting-point metal for the interconnect is effective in the manufacturing process of the resistance change type memory.

The interconnect 60 including the high-melting-point conductor described in the present embodiment may be used not only for the semiconductor devices described in Applications 1 to 3 but also for semiconductor memories such as a DRAM or an SRAM or for an image sensor (solid-state image sensing device). In a semiconductor device having a multilayer interconnect structure, the interconnect 60 including the high-melting-point conductor may be used for the interconnect at the interconnect level (lowermost interconnect level) immediately above the semiconductor substrate or may be used for the interconnect at the interconnect level (uppermost interconnect level) immediately under a pad provided in a semiconductor package. As the higher interconnect levels allow a larger interconnect width, the upper interconnects may be formed by using Al or Cu, and the lower interconnects may be formed by using the high-melting-point conductor (e.g., Mo) according to the present embodiment. Contrarily, the upper interconnects may be formed by using the high-melting-point conductor according to the present embodiment, and the lower interconnects may be formed by using Al or Cu.

(5) Manufacturing Methods

Methods of manufacturing the semiconductor device according to the present embodiment are described with reference to FIG. 21 to FIG. 30.

<Manufacturing Method 1>

Manufacturing method 1 of the semiconductor device according to the present embodiment is described with reference to FIG. 21 to FIG. 24. FIG. 21 to FIG. 24 schematically show sectional process views of steps in Manufacturing method 1 of the semiconductor device according to the present embodiment.

As shown in FIG. 21, components (not shown) of the semiconductor device such as a transistor, capacitor, and a memory element are formed on the surface of a semiconductor substrate 10. On the semiconductor substrate 10 on which the elements are formed, an interlayer insulating film 78 is formed, for example, by a chemical vapor deposition (CVD) method or a coating method. The upper surface of the formed interlayer insulating film 78 is planarized, for example, by chemical mechanical polishing (CMP).

An opening (not shown) is formed at a predetermined position in the interlayer insulating film 78. A conductor is formed in the opening and on the interlayer insulating film 78, for example, by a physical vapor deposition (PVD) method. The conductor is then subjected to CMP or etchback so that the conductor remains in the opening. As a result, the conductor is embedded in the opening, and a contact plug (not shown) or a via plug (not shown) is formed in the interlayer insulating film 78. The conductor for forming the plug may be the above-described high-melting-point conductor (e.g., W or Mo).

A contact layer (barrier metal film) 67 and an interconnect material 60Z are sequentially deposited on the plug and the interlayer insulating film 78 to have a predetermined thickness. The contact layer 67 is provided to ensure the contact between the interconnect material 60Z and the interlayer insulating film 78. For example, in accordance with the interconnect material 60Z, the contact layer 67 is selected from the group including tungsten nitride (WN), MoN, Ti, TiN, Ta, tantalum nitride (TaN), Ru, and rhenium nitride (RuN).

For example, the interconnect material 60Z and the contact layer 67 are deposited by the PVD method. For example, when the interconnect material 60Z is deposited by a DC sputtering method, it is preferable that the pressure of Ar gas as the sputtering gas is set to 1 Pa or less, and the discharge voltage is set to 300 V or more.

For example, the interconnect material 60Z includes at least one material (element) selected from the group including Mo, W, Ru, Ta, Co, and Ni. The interconnect material 60Z is not limited to the high-melting-point metal, and may be a silicide such as MoSi, WSi, NiSi, or CoSi. When the interconnect material 60Z is Mo, MoN or TiN is selected from the above-mentioned materials of the contact layer 67. However, no contact layer 67 may be formed, and the interconnect material 60Z may be directly formed on the interlayer insulating film 78.

It is particularly preferable that a conductor (e.g., Mo, Ru, or Ta) having a recrystallization temperature of 1000° C. or less is used for the interconnect material 60Z among the above-mentioned high-melting-point metals and the silicides as high-melting-point conductors. The interconnect material 60Z may have a stack structure of a silicon layer and a high-melting-point metal layer, a stack structure of a silicide layer and a high-melting-point metal layer, a stack structure of a silicon layer and a high-melting-point silicide layer, or a single layer structure of a silicide layer.

When a barrier film is formed by the self-passivation of a metal element, a metal (metal element) other than the high-melting-point metal may be added to the high-melting-point metal as the interconnect material. It is preferable that the metal to be added is selected from metals higher in diffusion velocity than the high-melting-point metal (e.g., Mo or W) as the interconnect material 60Z. It is also preferable that a material (additional metal) to which a compound of the additional metal and the high-melting-point metal does not have high resistance is added to the high-melting-point conductor. It is also preferable that a material (additional metal) which forms a chemically stable oxide or nitride is added to the high-melting-point metal.

It is preferable that the metal to be added is selected from materials in which the oxide formation energy of the added metal is less than the oxide formation energy of the high-melting-point metal. When the interconnect material 60Z is made of Mo or W, a material having an oxide formation energy of 450 kJ/mol or less is preferably added to the Mo layer or W layer. For example, at least one material selected from Al, Zr, Ti, and V is used as the additional metal.

A material in which the nitride formation energy of the metal is less than the nitride formation energy of the high-melting-point metal may be added to the high-melting-point metal layer. When the interconnect material 60Z is Mo, a material having a nitride formation energy of 100 kJ/mol or less is preferably added to the Mo layer. For example, at least one material selected from Al, Zr, Ti, and V is used as the additional metal.

The additional metal may be included in a sputtering target, or may be added to the deposited interconnect material by ion implantation.

As described above, the semiconductor substrate 10 may be heat-treated, for example, at a temperature of 400° C. to 500° C. in a period in which the interconnect material 60Z is deposited. When the interconnect material 60Z is deposited on the interlayer insulating film 78 under a high-temperature condition in which the substrate is heat-treated, crystal growth in the high-melting-point conductive layer 60Z as the interconnect material is accelerated, and the diameter of grains constituting the high-melting-point conductive layer 60Z increases. This makes it possible to reduce crystal grain boundaries and reduce the resistance of the interconnect. In accordance with the high-melting-point conductor that forms the interconnect, the heating temperature of the substrate may be set to 500° C. or more or may be set to 400° C. or less. When the interconnect material is deposited by a heat treatment of the substrate, it is preferable that a gas such as oxygen or nitrogen that easily reacts with the interconnect material 60Z is not included in the formation conditions.

When the interconnect material 60Z has a polymetal structure, a silicide layer may be formed between the high-melting-point metal layer and a polysilicon layer by a heat treatment for the crystallization of the high-melting-point metal layer.

A silicon nitride (SiN) layer 68 is deposited on the interconnect material 60Z as a cap layer (or mask layer), for example, by a plasma CVD method at a film formation temperature of 400° C. or less. A silicon oxide layer (e.g., TEOS layer) 90 is deposited on the cap layer 68. It is preferable that when the insulating film (here, SiN layer) that directly contacts the interconnect material 60Z is formed on the interconnect material 60Z, the gas pressure of $N_2$ (or $O_2$) and the temperature during film formation are properly set so that the interconnect material 60Z is not nitrided (or oxidized).

As shown in FIG. 22, a resist mask (not shown) having a predetermined pattern is formed on the silicon oxide layer 90 by a photolithographic process. The resist mask is then used as a mask to fabricate the silicon oxide layer 90 by an RIE method. As a result, the mask layer 90 having a predetermined interconnect pattern is formed on the SiN layer 68. After the mask layer 90 is formed, the resist mask is removed.

The fabricated mask layer 90 is used as a mask to fabricate the cap layer 68, the interconnect material 60Z, and the contact layer 67 by the reactive ion etching (RIE) method. Depending on the kinds of mask layer and interconnect material and the combination thereof, a chlorine (Cl) gas or a fluorine (F) gas may be used as the etching gas for use in the RIE.

As a result of the etching of the cap layer and the interconnect material, a high-melting-point conductive layer (interconnect) 60 having a predetermined pattern (layout, interconnect width, or interconnect pitch) is formed on the interlayer insulating film 78 and the plug (not shown), as shown in FIG. 23.

A sidewall film formed by the sidewall transfer technique may be used as a mask to pattern and fabricate the interconnect.

After the mask layer on the cap layer 68 and residual generated by the fabrication are removed, the high-melting-point conductive layer 60 is heat-treated in a reduction atmosphere. The reduction atmosphere is formed by using a hydrogen ($H_2$) gas or an ammonia ($NH_3$) gas. The high-melting-point conductive layer 60 is reduced by the heat treatment in the reduction atmosphere. That is, a surface oxide film (native oxide film) on the high-melting-point conductive layer 60 generated by the fabrication is reduced, and the oxide film is removed from the surface of the high-melting-point conductive layer 60. As a result, the reduction (scale-down, shrinking) of the dimension of the interconnect attributed to the native oxide film on the high-melting-point conductive layer is inhibited.

Post annealing is then conducted to increase the grain diameter of the high-melting-point conductive layer 60 (to recrystallize the high-melting-point conductive layer 60). This post annealing may be conducted in the same process as the heat treatment in the reduction atmosphere, or may be conducted in a separate process.

As shown in FIG. 24, a barrier film 62 is formed on the side surface (upper surface) of the high-melting-point conductive layer 60 as the interconnect.

For example, when an oxide of the high-melting-point conductor (high-melting-point metal) is formed as the barrier film, the gas pressure of the oxidizing atmosphere and the heating temperature (annealing temperature) for forming the barrier film 62 are set so that the oxidizing velocity of the high-melting-point conductor is higher than the vaporization velocity of the high-melting-point conductor (and its oxide). When such conditions are set, the oxide film as the barrier film 62 remains on the side surface of the high-melting-point conductive layer 60 without the vaporization (sublimation) of the high-melting-point conductor (and the oxide of the high-melting-point conductor).

For example, when an Mo oxide film is formed on the side surface of the Mo layer as the high-melting-point conductive layer 60, it is preferable that the heating temperature is set to a range of 400° C. to 450° C. and that the $O_2$ gas pressure in the oxidizing atmosphere is set to 60 Pa or less. This lessens the reduction in the interconnect dimension (interconnect width or thickness) resulting from the vaporization of the high-melting-point conductor or the excessive oxidizing of the high-melting-point conductor, and inhibits the rise in the resistance value of the interconnect resulting from the formation of the barrier film. It is particularly preferable that an oxide as the barrier film is formed on the high-melting-point conductive layer 60 under conditions in which the high-melting-point conductor hardly vaporizes.

For example, the Mo oxide film as the barrier film 62 is a film including at least $MoO_2$. It is preferable that the time of the annealing is set so that the thickness of the $MoO_2$ film as the barrier film ranges from about 1 nm to 3 nm under the above-mentioned conditions of the heating temperature and the gas pressure.

The post annealing to increase the grain diameter of the high-melting-point conductor may be conducted in the same process as the heat treatment for forming the barrier film.

When a nitride of the high-melting-point conductor (high-melting-point metal) is formed as the barrier film, the gas pressure of the nitriding atmosphere and the heating temperature are also set so that the nitriding velocity of the high-melting-point conductor is higher than the vaporization velocity of the high-melting-point conductor (and its nitride). A predetermined pressure of an $NH_3$ gas may be used as the gas for forming the reduction atmosphere during the above-mentioned heat treatment in the reduction atmosphere for removing the surface oxide film or an NH$_2$ gas or an NH$_3$ gas may be mixed during or after the reduction heat treatment so that a nitride film as the barrier film 62 is formed on the exposed surface (side surface) of the high-melting-point conductive layer 60 substantially simultaneously with the removal of the surface oxide film.

As described above, when a metal (metal element) other than the high-melting-point metal is added to the high-melting-point conductive layer 60, the added metal element is moved and separated out to the exposed side (here, side surface) of the high-melting-point conductive layer by the heat treatment in the oxidizing atmosphere or nitriding atmosphere, and a self-passivation film of the additional metal is formed on the side surface of the high-melting-point conductive layer 60 as the barrier film, as has been described with reference to FIG. 13A to FIG. 13C.

However, in order to accelerate the self-passivation of the additional metal, the metal to be added is selected from materials whereby the oxide formation energy or nitride formation energy of the additional metal is less than the oxide formation energy or nitride formation energy of the high-melting-point metal. When the high-melting-point conductive layer 60 is an Mo layer, Al or Zr is added, and Al oxide, Al nitride, Zr oxide, or Zr nitride is formed as a self-passivation film, as described above. When a self-passivation film of the additional metal is formed as the barrier film 62, the concentration profile of the additional metal in the high-melting-point conductive layer 60 shows that the concentration of the additional metal on the exposed side (barrier film side) of the high-melting-point conductive layer 60 is higher than the concentration of the additional metal in the center of the high-melting-point conductive layer 60.

The barrier film (or self-passivation film) 62 may be formed by an oxide including the high-melting-point metal and the additional metal or by a nitride including the high-melting-point metal and the additional metal.

The cap layer 68 may be removed from the high-melting-point conductive layer 60 before the barrier film (or self-passivation film) is formed. In this case, the barrier film 62 is formed not only on the side surface of the high-melting-point conductive layer 60 but also on the upper surface of the high-melting-point conductive layer 60. The heat treatment to increase the grain diameter of the high-melting-point metal layer may be conducted in the same process as the heat treatment for forming the self-passivation film of the additional metal.

When the barrier film (or self-passivation film) 62 is formed by the oxidizing treatment of the high-melting-point conductive layer 60, oxygen may be present at the interface between the high-melting-point conductive layer 60 and the barrier film 62. In this case, in an interconnect structure including the high-melting-point conductive layer 60 and the barrier film 62, the oxygen concentration at the interface between the high-melting-point conductive layer 60 and the barrier film 62 is higher than the oxygen concentration at the center of the high-melting-point conductive layer 60. Similarly, when the barrier film (or self-passivation film) 62 is formed by the nitriding treatment of the high-melting-point conductive layer 60, nitrogen is present at the interface between the high-melting-point conductive layer 60 and the barrier film 62. In this case, in an interconnect structure including the high-melting-point conductive layer 60 and the barrier film 62, the nitrogen concentration at the interface between the high-melting-point conductive layer 60 and the barrier film 62 is higher than the nitrogen concentration at the center of the high-melting-point conductive layer 60.

It is thus preferable that the formation conditions of the barrier film are set so that the oxygen concentration or nitrogen concentration is higher at the interface between the high-melting-point conductive layer 60 and the barrier film 62 in order to improve the function as the barrier film 62. It is also preferable that the formation conditions of the barrier film 62 are set so that the oxygen concentration or nitrogen concentration is lower at the center of the high-melting-point conductive layer 60 in order to increase the electrical conductivity of the interconnect (high-melting-point conductive layer) 60 (to reduce the resistance of the interconnect).

When the barrier film 62 is formed by the oxidizing reaction or nitriding reaction with the high-melting-point conductive layer, the interconnect width of the conductive layer 60 is slightly smaller than the interconnect width of the cap layer 68. In this case, almost no step is formed between the side surface of the barrier film 62 and the side surface of the cap layer 68. When the barrier film 62 is formed in this way, a micropattern (nano-scale pattern) can be formed without the increase in the interconnect width of the interconnect structure including the high-melting-point conductive layer 60 and the barrier film 62.

An interlayer insulating film is then formed over the high-melting-point conductive layer 60. A silicon compound such as SiN, SiO$_2$, SiOC, or SiCN is properly selected for the interlayer insulating film in accordance with the design of a capacitance between the interconnects.

For example, as shown in FIG. 25, a SiN film 69 as the interlayer insulating film (passivation film) is deposited, for example, by an atomic layer deposition (ALD) method under a temperature condition of 500° C. Further, an SiO$_2$ layer (not shown) as the interlayer insulating film is deposited on the SiN film 69, for example, by the CVD method or the coating method.

As described above, the barrier film 62 is formed on the side surface of the high-melting-point conductive layer 60, such that the diffusion of the nitriding species (N) for forming the SiN film 69 as the interlayer insulating film into the high-melting-point conductive layer 60 can be inhibited. Therefore, the rise in the resistance value of the high-melting-point conductive layer 60 resulting from the diffusion of nitrogen is inhibited.

For example, when a high-melting-point conductor (e.g., Mo) that tends to be adversely affected by nitrogen is used for the conductive layer 60 for forming the wring line, providing the barrier film made of an oxide film at the end of the conductive layer 60 is effective.

When the barrier film is formed by the oxidizing treatment or nitriding treatment of the high-melting-point conductive layer, a step is not easily formed between the side surface of the cap layer and the side surface of the barrier film 62. Therefore, the performance of contact of the interlayer insulating film (SiN film) 69 with the interconnect structure including the barrier film is improved, and the coverage performance of an interlayer insulating film to be formed in a subsequent process is improved.

When the interlayer insulating film made of an oxide is formed on the high-melting-point conductive layer, it is preferable that the formation temperature of the silicon oxide as the interlayer insulating film is set to a range of 400° C. to 450° C., particularly preferably, to 400° C. or less in the initial stage of the formation of the interlayer insulating film. It is also preferable that the oxygen gas pressure is set to a condition of 60 Pa or less when the interlayer insulating film made of an oxide is formed. The temperature condition and the gas pressure condition are thus set, thereby inhibiting abnormal oxidizing of the high-melting-point conductor as the interconnect, deterioration of the barrier film, and vaporization of the high-melting-point conductor and the barrier film. This inhibits the rise in the resistance value of the interconnect resulting from the reduction in the interconnect dimension, and the rise in the resistance value of the interconnect resulting from impurity diffusion into the interconnect.

After the deposition of a thin interlayer insulating film to cover the interconnect including the high-melting-point conductor at a film formation temperature of 400° C. or less in the initial stage of the deposition of the interlayer insulating film made of an oxide, a thick interlayer insulating film may be deposited at a film formation temperature of more than 400° C. When the interlayer insulating film at a given interconnect level is formed in separate steps (formation temperature conditions), the post annealing for the high-melting-point conductive layer may be conducted in the same process as the formation of the interlayer insulating film. As has been described with reference to FIG. 16, an air gap may be formed without completely embedding the interlayer insulating film in the space between the adjacent interconnects (high-melting-point conductive layers) 60.

At the formation position of the plug connected to the upper surface of the interconnect 60, the interlayer insulating film and the cap layer 68 are removed from the parts above the interconnect 60 by a photolithographic process and etching, and the upper surface of the interconnect 60 is exposed. The above-mentioned interconnect forming process is repeated until a predetermined interconnect level is reached, such that the semiconductor device according to the present embodiment is formed.

While the high-melting-point conductive layer deposited by the PVD method has been described in the above semiconductor device manufacturing method, the same parameters can be applied to the CVD method, except for the parameters limited to the PVD method.

As described above, in the methods of manufacturing the semiconductor device according to the present embodiment, the interconnect 60 is formed by using the high-melting-point conductor. The high-melting-point conductive layer 60 as the interconnect is made of a material having a melting temperature of 1000° C. or more, and is formed, for example, by a material selected from the group including Mo, W, Ru, Ta, Co, and Ni. The high-melting-point conductive layer 60 may otherwise be formed by using a silicide. The high-melting-point conductive layer 60 as the interconnect is preferably made of a material such as Mo, Ru, and Ta having a recrystallization temperature of 1000° C. or less.

Thus, in the methods of manufacturing the semiconductor device according to the present embodiment, the interconnect is formed by using the heat-resistant high-melting-point conductor, such that deterioration of the interconnect resulting from heat can be inhibited as compared with a low-melting-point interconnect material. Moreover, the crystallinity of the interconnect formed by the high-melting-point conductor can be improved (recrystallization) without the increase in the manufacturing process by using the interconnect material having a recrystallization temperature of 1000° C. or less.

In the process of manufacturing the semiconductor device according to the present embodiment, heat is applied to the high-melting-point conductive layer 60 during or after the deposition of the high-melting-point conductive layer 60 as the interconnect. This accelerates the crystallization of the high-melting-point conductive layer 60, and increases the diameter of the crystal grains included in the high-melting-point conductive layer 60. As a result, in the semiconductor device according to the present embodiment, the grain boundary scattering of electrons is reduced, and the resistance value (resistivity) of the interconnect formed by the high-melting-point conductive layer 60 decreases.

For example, as compared with a high-melting-point conductor having a recrystallization temperature of more than 1000° C., a high-melting-point conductor such as Mo having a recrystallization temperature of 1000° C. or less is highly effective in increasing the diameter of the crystal grains included in the high-melting-point conductive layer by heating, and can further reduce the resistance of the interconnect.

In the methods of manufacturing the semiconductor device according to the present embodiment, the barrier film 62 or the self-passivation film 62 is formed on the side surface (exposed surface) of the high-melting-point conductive layer 60 as the interconnect. The barrier film 62 or the self-passivation film 62 is formed between the high-melting-point conductive layer 60 and the interlayer insulating film. This makes it possible to inhibit the diffusion of an oxidizing species or a nitriding species into the high-melting-point conductive layer during the formation of the interlayer insulating film, and prevent the reduction in the width/thickness (sectional area) of the high-melting-point conductive layer 60 resulting from a chemical reaction between the oxidizing species/nitriding species and the high-melting-point conductor. Moreover, if the conditions for the heat treatment of the high-melting-point metal layer and the formation conditions of the interlayer insulating film are set in consideration of the oxidizing velocity and vaporization velocity of the high-melting-point conductive layer as the interconnect, the reduction in the dimension of the interconnect resulting from the oxidizing or sublimation of the interconnect can be inhibited. As a result, the rise in the resistance value of the high-melting-point conductive layer 60 as the interconnect can be inhibited.

The reduction of the high-melting-point conductive layer 60 and the formation of the barrier film 62 or the self-passivation film 62 can be conducted in the same process as the annealing to increase the diameter of the crystal grains included in the high-melting-point conductive layer 60. This makes it possible to prevent the rise in the resistance value of the interconnect including the high-melting-point conductive layer 60 and improve the crystallinity of the conductive layer 60 to reduce the resistance of the interconnect without the increase in the semiconductor device manufacturing process.

As described above, according to the methods of manufacturing the semiconductor device of the present embodiment, it is possible to provide a semiconductor device including an interconnect reduced in resistance.

<Manufacturing Method 2>

Manufacturing method 2 of the semiconductor device according to the present embodiment is described with reference to FIG. 26 to FIG. 30. Components, processes, and advantageous effects in Manufacturing method 2 which are the same as those in Manufacturing method 1 are described when necessary. FIG. 26 to FIG. 30 schematically show sectional process views of steps in Manufacturing method 2 of the semiconductor device according to the present embodiment.

Manufacturing method 2 of the semiconductor device according to the present embodiment is applicable, for example, to a method of manufacturing a cross point type memory cell. In the semiconductor device manufacturing method according to the present embodiment, an interconnect including a high-melting-point conductor is formed by a sidewall interconnect forming technique that uses a step in a trench formed in a substrate (e.g., interlayer insulating film) to form a micro (nano-scale) interconnect pattern.

Figure 26:
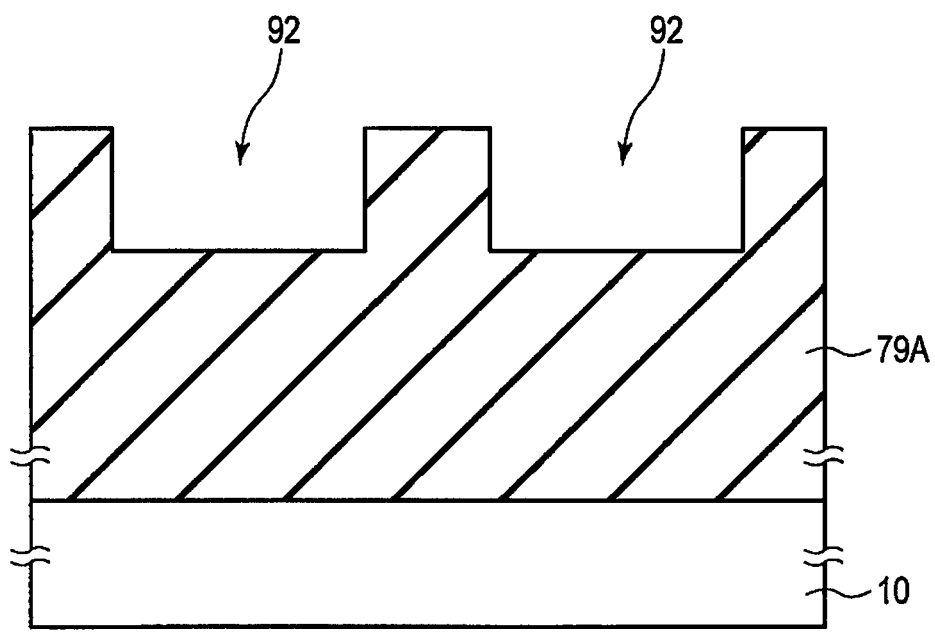
FIG. 26 is a sectional process view showing a step in Manufacturing method 2 of the semiconductor device according to the embodiment.

As shown in FIG. 26, an insulating film (interlayer insulating film) 79A is deposited, for example, by the CVD method, on a semiconductor substrate 10 in which elements are formed. The upper surface of the deposited insulating film 79A is then planarized, for example, by the CMP method. The insulating film 79A is fabricated by the photolithographic technique and the RIE method, and a trench (depression) 92 for forming an interconnect (e.g., word line) is formed in the insulating film 79A. The trench 92 extends in the row direction of the memory cell array.

As shown in FIG. 27, an interconnect material 60Z is embedded in the trench, for example, by the PVD method or the CVD method. The interconnect material 60Z is, as described above, a high-melting-point conductor. For example, Mo is deposited as the interconnect material 60Z. Silicide may otherwise be deposited as the interconnect material 60Z. A metal (e.g., Al or Zr) for forming a self-passivation film may be added to the interconnect material 60Z. The interconnect material 60Z may have a single layer structure of a high-melting-point conductor, or may have a stack structure including high-melting-point conductors such as a polymetal structure or a polycide structure.

A contact layer (barrier metal film) 67 may be deposited between the interconnect material 60Z and the insulating film 79A. For example, when the interconnect material 60Z is made of Mo, MoN or TiN is deposited as the contact layer 67.

As shown in FIG. 28, the interconnect material is etched back, for example, by the RIE method or an ion beam etching (IBE) method so that the interconnect material only remains on the side surface of the trench formed in the insulating film 79A. As a result, the high-melting-point conductor remains on the side surface of the trench in a self-aligning manner, and an interconnect (e.g., word line) 60B made of the high-melting-point conductor is formed. The interconnect 60B thus formed by using the step has, for example, a dimension (interconnect width) smaller than the lithographic resolution limit.

The substrate may be heat-treated during the deposition of the interconnect material including the high-melting-point conductor, and the high-melting-point conductor may be annealed in a reduction atmosphere after the deposition of the high-melting-point conductor. As a result, the diameter of the crystal grains included in the high-melting-point conductor is increased, and the resistance of the interconnect made of the high-melting-point conductor can be reduced.

After the high-melting-point conductor is fabricated into a predetermined interconnect pattern, the high-melting-point conductor 60B may be heat-treated in an oxidizing atmosphere or nitriding atmosphere to form a barrier film 67 made of an oxide or nitride of the high-melting-point conductor 60B. A self-passivation film of the metal added to the high-melting-point conductor 60B may be formed. This makes it possible to prevent the rise in the resistance value of the high-melting-point conductor 60B resulting from an oxidizing species or a nitriding species during the formation of the interlayer insulating film in a subsequent process.

As shown in FIG. 29, the trench in the interlayer insulating film 79A is filled with an insulator, and an interlayer insulating film 79B is embedded in the space between the formed interconnects 60B. It is preferable that, in at least the initial stage of its formation, the interlayer insulating film 79B covering the interconnect 60B is formed under conditions in which the high-melting-point conductive layer as the interconnect is hardly oxidized (or nitrided), for example, at a film formation temperature of 400° C. or less.

The upper surface of the interconnect 60B made of the high-melting-point conductor is then exposed, and a cell unit CU including a memory element (variable resistive element or phase change element) 30 is formed on the interconnect 60B. The cell unit CU is fabricated, for example, by the sidewall transfer technique.

An insulating film 79C is then formed over the cell unit CU. In a manner substantially similar to the steps shown in FIG. 26 to FIG. 29, a trench extending in the column direction is then formed in the insulating film 79C, and an interconnect (e.g., bit line) on the cell unit CU is formed on the side surface of the trench by the sidewall interconnect forming technique.

In the step of depositing the high-melting-point conductor, the high-melting-point conductor as the interconnect may be selectively formed on the side surface of the trench in the interlayer insulating film 79A alone by a selective CVD method or a bias PVD method.

For example, as shown in FIG. 30, when the high-melting-point conductor as the interconnect material is deposited by the selective CVD method, a foundation layer 95 which shows the selectivity of the formation of the high-melting-point conductor is previously formed on the interlayer insulating film 79A along the side surface of the trench 92. Here, the foundation layer 95 is removed from parts where no interconnects are formed, and the interlayer insulating film 79A is exposed. As a result, the high-melting-point conductor as the interconnect is selectively formed on the foundation layer 95 on the side surface of the trench.

The foundation layer 95 in which the high-melting-point conductive layer is easily grown may be formed along the side surface of the trench 92 formed in the interlayer insulating film 79A, and a layer in which the high-melting-point conductive layer is not easily grown may be formed on the upper surface of the exposed insulating film 79A and on the bottom surface of the trench. The material of the foundation layer 95 and the material of the insulating film 79A are preferably selected to ensure high selectivity for the growth of the high-melting-point conductor.

If sufficient selectivity is ensured between the foundation (the foundation layer and the interlayer insulating film) and the high-melting-point conductive layer, the step of fabricating the high-melting-point conductor is substantially unnecessary, and the number of steps in the manufacturing process for forming the semiconductor device can be eliminated. However, even if the foundation layer 95 is formed, the selectivity for the growth of the high-melting-point conductor may collapse. Therefore, a step (e.g., etchback or wet etching) for fabricating the conductor may be provided in the manufacturing process to prevent a decrease in semiconductor device reliability and yield.

When the high-melting-point conductor as the interconnect material is formed by the bias PVD method, residual of the conductor may be generated on the bottom of the trench 92 and the top of the insulating film 79A. Therefore, when the high-melting-point conductor is deposited by the bias PVD method, a step of removing the residual of the conductor is provided. However, the conductive layer needs to be sufficiently fabricated in a process in which the high-melting-point conductive layer is conformally formed all over the insulating film 79A. In contrast, when the high-melting-point conductive layer is formed by the bias PVD method, the load on the fabrication of the high-melting-point conductive layer (interconnect material) in the manufacturing process can be reduced.

As described above, in Manufacturing method 2 of the semiconductor device according to the present embodiment, the interconnect including the high-melting-point conductor is formed on the side surface of the trench formed in the insulating film (interlayer insulating film). As in Manufacturing method 2, an interconnect 61 is formed by using the step (trench) formed in the member (interlayer insulating film or trench) so that the high-melting-point conductive layer 61 remains selectively (in a self-aligning manner) on the side surface of the trench. As a result, a micro interconnect equal to or less than the lithographic (exposure) resolution critical dimension can be formed. Moreover, the step of patterning the interconnect can be eliminated.

In Manufacturing method 2 according to the present embodiment, the high-melting-point conductor can be used for the interconnect, and the resistance of the interconnect can be reduced by increasing the grain diameter of the high-melting-point conductor and inhibiting the diffusion of the reacting species to the high-melting-point conductor, as in Manufacturing method 1.

Consequently, according to Manufacturing method 2 of the semiconductor device in the present embodiment, it is possible to provide a semiconductor device including an interconnect reduced in resistance, and simplify the semiconductor device manufacturing process.

While the method of manufacturing the resistance change type memory having the cross point type memory cell array has been shown by way of example in connection with Manufacturing method 2 of the semiconductor device according to the present embodiment, the micro interconnect pattern forming method that uses the step described in Manufacturing method 2 can be applied to methods of manufacturing other semiconductor memories (e.g., flash memory) and semiconductor integrated circuits.

[Addition]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device manufacturing method comprising:
    forming a first interlayer insulating film on a semiconductor substrate; forming a high-melting-point conductive layer on the first interlayer insulating film; fabricating the high-melting-point conductive layer to have an interconnect pattern; after fabricating the high-melting-point conductive layer to have the interconnect pattern, subjecting exposed side surfaces of the fabricated high-melting-point conductive layer having the interconnect pattern to a first heat treatment in a reduction atmosphere to remove a native oxide film on the exposed side surfaces of the fabricated high-melting-point conductive layer by a reduction treatment; subjecting the fabricated high-melting-point conductive layer to a second heat treatment in a reactive gas atmosphere to form a barrier film on the exposed side surfaces of the high-melting-point conductive layer, the barrier film including a compound of a contained element in the high-melting-point conductive layer; and forming a second interlayer insulating film covering the high-melting-point conductive layer,
    wherein a first metal element as the contained element in the high-melting-point conductive layer is at least one element selected from the group including Mo, W, Ru, Ta, Co, and Ni.

2. The semiconductor device manufacturing method according to claim 1, wherein
    the barrier film inhibits the diffusion of an impurity originating from the second interlayer insulating film into the high-melting-point conductive layer when the second interlayer insulating film is deposited.

3. The semiconductor device manufacturing method according to claim 1, wherein
    the high-melting-point conductive layer is a material having a recrystallization temperature of 1000° C. or less.

4. The semiconductor device manufacturing method according to claim 1, wherein
    the high-melting-point conductive layer includes Mo, and the barrier film includes $MoO_2$.

5. The semiconductor device manufacturing method according to claim 1, wherein
    the high-melting-point conductive layer which includes a first metal element and a second metal element as the contained element in the high-melting-point conductive layer is subjected to the second heat treatment, the second metal element being lower in compound formation energy than the first metal element, and
    the barrier film which includes a compound of the second metal element is formed by the self-passivation of the second metal element.

6. The semiconductor device manufacturing method according to claim 5, wherein
    the second metal element is at least one element selected from the group including Al, Zr, Ti, and V.

7. The semiconductor device manufacturing method according to claim 1, wherein
    the high-melting-point conductive layer selectively remains on a side surface of a trench formed in the first interlayer insulating film, and the high-melting-point conductive layer fabricated into the interconnect pattern is formed.

8. The semiconductor device manufacturing method according to claim 1, wherein
    the second heat treatment is conducted under conditions in which the vaporization velocity of the high-melting-point conductive layer is less than the velocity of a chemical reaction of the high-melting-point conductive layer.

9. The semiconductor device manufacturing method according to claim 1, wherein
    the high-melting-point conductive layer is crystallized in at least one of the first and second heat treatments.

* * * * *